United States Patent
Zhou et al.

(10) Patent No.: US 8,374,050 B2
(45) Date of Patent: Feb. 12, 2013

(54) MULTI-PORT MEMORY USING SINGLE-PORT MEMORY CELLS

(75) Inventors: Ting Zhou, Orinda, CA (US); Ephrem Wu, San Mateo, CA (US); Sheng Liu, Cupertino, CA (US); Hyuck Jin Kwon, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 125 days.

(21) Appl. No.: 13/153,392

(22) Filed: Jun. 4, 2011

(65) Prior Publication Data

US 2011/0310691 A1    Dec. 22, 2011

Related U.S. Application Data

(60) Provisional application No. 61/351,336, filed on Jun. 4, 2010.

(51) Int. Cl.
*G11C 8/00* (2006.01)
*G06F 13/00* (2006.01)
*G06F 13/28* (2006.01)

(52) U.S. Cl. ............. 365/230.05; 365/230.03; 711/131; 711/144; 711/149

(58) Field of Classification Search ............. 365/230.03, 365/230.05; 711/131, 144, 149
See application file for complete search history.

(56) References Cited

U.S. PATENT DOCUMENTS

| | | | | |
|---|---|---|---|---|
| 5,903,911 A * | 5/1999 | Gaskins | ...................... | 711/141 |
| 6,189,073 B1 | 2/2001 | Pawlowski | | |
| 6,882,562 B2 | 4/2005 | Beucler | | |
| 7,073,035 B2 * | 7/2006 | Ware et al. | ..................... | 711/154 |
| 7,307,912 B1 * | 12/2007 | Vernenker et al. | ....... | 365/230.05 |
| 7,333,381 B2 | 2/2008 | Rosen | | |
| 7,461,191 B2 | 12/2008 | Baer et al. | | |
| 7,533,222 B2 | 5/2009 | Leung | | |
| 7,903,497 B2 | 3/2011 | Terzioglu et al. | | |
| 2006/0053255 A1 * | 3/2006 | Sugizaki | ....................... | 711/122 |
| 2007/0183241 A1 | 8/2007 | Batra | | |

OTHER PUBLICATIONS

Ronald L. Rivest and Lance A. Glasser, "A Fast Multiport Memory Based on Single-Port Memory Cells," Jul. 1991, pp. 1-12, MIT Laboratory for Computer Science, Cambridge, MA.

* cited by examiner

*Primary Examiner* — Ly D Pham
(74) *Attorney, Agent, or Firm* — Otterstedt, Ellenbogen & Kammer, LLP

(57) ABSTRACT

A memory operative to provide multi-port functionality includes multiple single-port memory cells forming a first memory array. The first memory array is organized into multiple memory banks, each of the memory banks comprising a corresponding subset of the single-port memory cells. The memory further includes a second memory array including multiple multi-port memory cells and is operative to track status information of data stored in corresponding locations in the first memory array. At least one cache memory is connected with the first memory array and is operative to store data for resolving concurrent read and write access conflicts in the first memory array. The memory includes a controller operative: to receive the status information and to determine a validity of data stored in the first memory array as a function of the status information; to control a manner in which data is stored in the memory for avoiding data overflow in the cache memory; and to resolve concurrent read and write access conflicts in the first memory array during the same memory cycle.

23 Claims, 9 Drawing Sheets

400

500

600

1100

MULTI-PORT MEMORY USING SINGLE-PORT MEMORY CELLS

CROSS-REFERENCE TO RELATED APPLICATION(S)

This application claims the benefit of U.S. Provisional Application No. 61/351,336 filed on Jun. 4, 2010, the disclosure of which is incorporated herein by reference in its entirety.

FIELD OF THE INVENTION

The present invention relates generally to the electrical, electronic and computer arts, and more particularly relates to random access memories.

BACKGROUND OF THE INVENTION

Multi-port memories are widely used in electronic applications in which high-speed data transfer is critical, including, but not limited to, data buffering, video processing, data communications, etc. Multi-port memory (e.g., dual-port memory), unlike its single-port memory counterpart, is generally characterized by its ability to read data from or write data to the memory on one port while simultaneously reading a second piece of data from or writing a second piece of data to the memory on another port. Hence, each port provides a separate independent read and write access path for reading data from the memory, or writing new data into the memory. One embodiment of a multi-port memory is a two-port memory, such as a single-port read, single-port write (1R1W) memory, which has a dedicated read port and a dedicated write port.

Multi-port memory is typically implemented using static random access memory (SRAM). In a conventional single-port architecture, each bit in an SRAM cell is stored on four transistors that form two cross-coupled inverters operative as a storage element of the memory cell. Two additional transistors serve to control access to the storage element during read and write operations. A typical SRAM cell uses six transistors and is thus often referred to as a 6T SRAM. In a multi-port architecture, two additional access transistors are generally used for each additional port; hence two-port functionality would be provided by an eight-transistor (8T) SRAM, three-port functionality would be provided by a ten-transistor (10T) SRAM, and so on. However, because implementing a true monolithic multi-port memory can consume a significant amount of area and power on an integrated circuit (IC) chip, there have been various proposed memory architectures which employ single-port memory cells, often referred to as single port read/write (1RW) memories, each having their own inherent disadvantages.

In one known approach, often referred to as double-pumping, time-domain multiplexing of the memory clock is utilized. Using this approach, a two-port memory functionality might be achieved using multiple single-port memory cells, with half of the memory clock cycle being dedicated to read operations and the other half being dedicated to write operations. By multiplexing the clock in this manner, conflicts between read and write accesses of the same memory cell during a given memory cycle can be avoided. Although a savings in chip area can be achieved using this approach, the data path is now narrower and has less bandwidth compared to an implementation using true two-port memory cells, and thus the memory system must, overall, be slower. Since the memory is, in effect, required to run at twice the clock rate of a memory comprised of true two-port memory cells, the maximum frequency is typically low (e.g., about 400 MHz for a 45-nanometer (nm) IC fabrication process).

Another approach is to divide the dual-port memory into banks of single-port memory cells. Provided there are no bank conflicts (i.e., the read address and the write address do not require accessing the same single-port memory bank during the same memory cycle), the memory can theoretically run at the maximum frequency of the single-port memory cells. When a bank conflict does arise however, a pipeline stall will typically occur, resulting in a latency penalty and the need for complex arbitration or control logic outside of the memory. Moreover, the latency of the memory will not be constant, but will instead be dependent on the specific read and write addresses. The pipeline stall may also reduce effective memory throughput since there is only one memory access instead of two accesses during stall.

SUMMARY OF THE INVENTION

The present invention, in accordance with illustrative embodiments thereof, advantageously utilizes primarily single-port read/write (1RW) memory cells to implement a multi-port memory functionality. Single-port memory cells are generally faster and consume substantially less power and chip area compared to multi-port memory cells. Consequently, a multi-port memory array implemented using a plurality of single-port memory cells in accordance with aspects of the invention beneficially provides enhanced performance, reduced power consumption and reduced chip area compared to a true monolithic multi-port memory cell implementation. Moreover, aspects of the invention essentially eliminate any latency penalty otherwise incurred by conventional approaches when read and write addresses attempt to access the same memory location during the same memory cycle. In this manner, embodiments of the invention support both low and fixed latency to the extent that a user virtually cannot distinguish the multi-port memory employing single-port memory cells from a monolithic multi-port memory utilizing true multi-port memory cells.

In accordance with an aspect of the invention, a memory operative to provide multi-port functionality includes multiple single-port memory cells forming a first memory array. The first memory array is organized into multiple memory banks, each of the memory banks comprising a corresponding subset of the single-port memory cells. The memory further includes a second memory array including multiple multi-port memory cells and is operative to track status information of data stored in corresponding locations in the first memory array. At least one cache memory is connected with the first memory array and is operative to store data for resolving concurrent read and write access conflicts to the first memory array which may occur during the same memory cycle. The memory includes a controller operative: to receive the status information from the second memory array and to determine a validity of data stored in the first memory array as a function of the status information; to control, as a function of the status information, a manner in which data is stored in the memory for avoiding data overflow in the cache memory; and to resolve concurrent read and write access conflicts to the first memory array during the same memory cycle.

In accordance with another aspect of the invention, a memory operative to provide n-port access functionality, where n is an integer greater than one, includes multiple m-port memory cells forming a first memory array, where m is an integer less than n. The first memory array is organized into multiple memory banks, each of the memory banks comprising a corresponding subset of the m-port memory cells. The memory further includes a second memory array including multiple multi-port memory cells and is operative to track status information of data stored in corresponding locations in the first memory array. At least one cache memory is connected with the first memory array and is operative to store data for resolving concurrent read and write access conflicts to the first memory array which may occur during the same memory cycle. The memory includes a controller operative: to receive the status information from the second memory array and to determine a validity of data stored in the first memory array as a function of the status information; to control, as a function of the status information, a manner in which data is stored in the memory for avoiding data overflow in the cache memory; and to resolve concurrent read and write access conflicts to the first memory array during the same memory cycle.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

The present invention, according to aspects thereof, will be described herein in the context of illustrative multi-port memory circuits implemented using primarily a plurality of single-port memory cells. It should be understood, however, that the present invention is not limited to these or any other particular circuit configurations. Rather, the invention is more generally applicable to techniques for implementing a multi-port memory using a plurality of single-port memory cells in such a way that conflicts between read and write accesses are easily resolved without increasing latency. A multi-port memory implemented using a plurality of single-port memory cells in accordance with aspects of the invention advantageously provides enhanced performance, reduced power consumption and reduced chip area, among other benefits, compared to a true (monolithic) multi-port memory cell implementation.

Techniques of the invention essentially eliminate the latency penalty otherwise incurred using conventional approaches when read and write addresses attempt to access the same memory cell during the same memory cycle. In this manner, embodiments of the invention support both low and fixed latency to the extent that a user essentially cannot distinguish the multi-port memory according to embodiments of the invention from a multi-port memory implementation utilizing true multi-port memory cells. Moreover, it will become apparent to those skilled in the art given the teachings herein that numerous modifications can be made to the embodiments shown that are within the scope of the present invention. That is, no limitations with respect to the specific embodiments described herein are intended or should be inferred.

Figure 1:
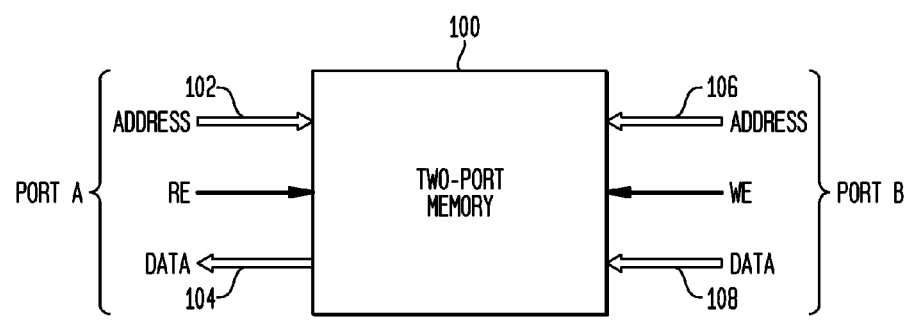
FIG. 1 is a block diagram depicting an exemplary two-port memory and corresponding control signals for accessing the memory.

FIG. 1 is a block diagram depicting an exemplary two-port memory 100 and corresponding control signals for accessing the memory. Two-port memory 100 preferably includes a first port (Port A), which may be a read port, having a first address bus 102 operative to convey a read address, a first data bus 104 operative to convey data read from the memory, and a read enable (RE) control signal, all associated with the first port. Likewise, memory 100 includes a second port (Port B), which may be a write port, having a second address bus 106 operative to convey a write address, a second data bus 108 operative to convey data to be written to the memory, and a write enable (WE) control signal, all associated with the second port.

Figure 2:
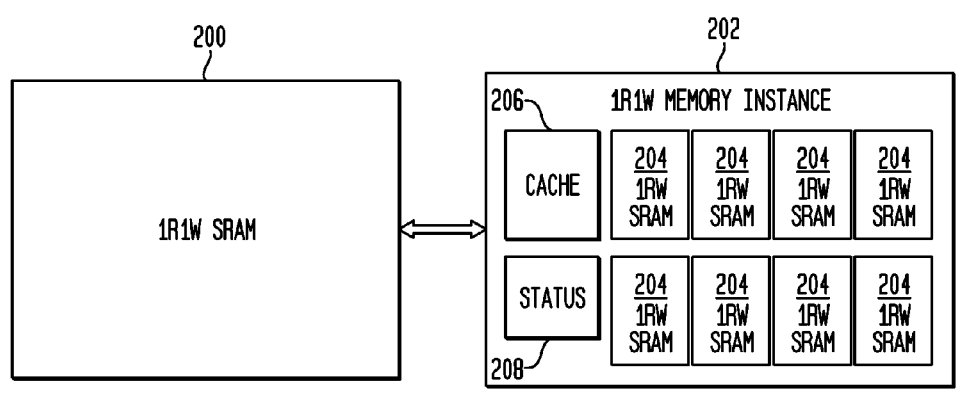
FIG. 2 is a block diagram conceptually illustrating a correspondence between a dual-port memory and an exemplary implementation of the two-port memory using primarily a plurality of single-port memory modules, according to an embodiment of the invention.

Disadvantages of using a monolithic multi-port memory include, but are not limited to, degraded performance (e.g., lower speed), increased chip area and increased power consumption, as previously stated. Embodiments of the invention address one or more problems associated with conventional multi-port memory architectures by utilizing primarily single-port (1RW) memory cells to implement a multi-port memory (e.g., 1R1W memory). With reference to FIG. 2, a block diagram conceptually illustrates a correspondence between a monolithic two-port memory 200 and an exemplary equivalent implementation of a two-port memory 202 which employs a plurality of single-port memory modules 204 (e.g., 1 RW SRAM), according to an embodiment of the invention. Memory 202 further includes a cache 206 and control circuitry 208, which may be operative to track a status of the single-port memories and the cache. Further details of the illustrative memory 202 will be described herein below.

Although embodiments of the invention may be shown with specific reference to a two-port memory implementation, merely for simplicity and economy of description, it is to be appreciated that the invention is not limited to two-port memory. Rather, principles of the present invention may be extended to construct a memory having essentially any number of ports (i.e., multi-port memory in general). Moreover, according to aspects of the invention, a higher port count multi-port memory can be constructed from a lower port count multi-port memory, as will become apparent to those skilled in the art given the teachings herein.

Figure 3:
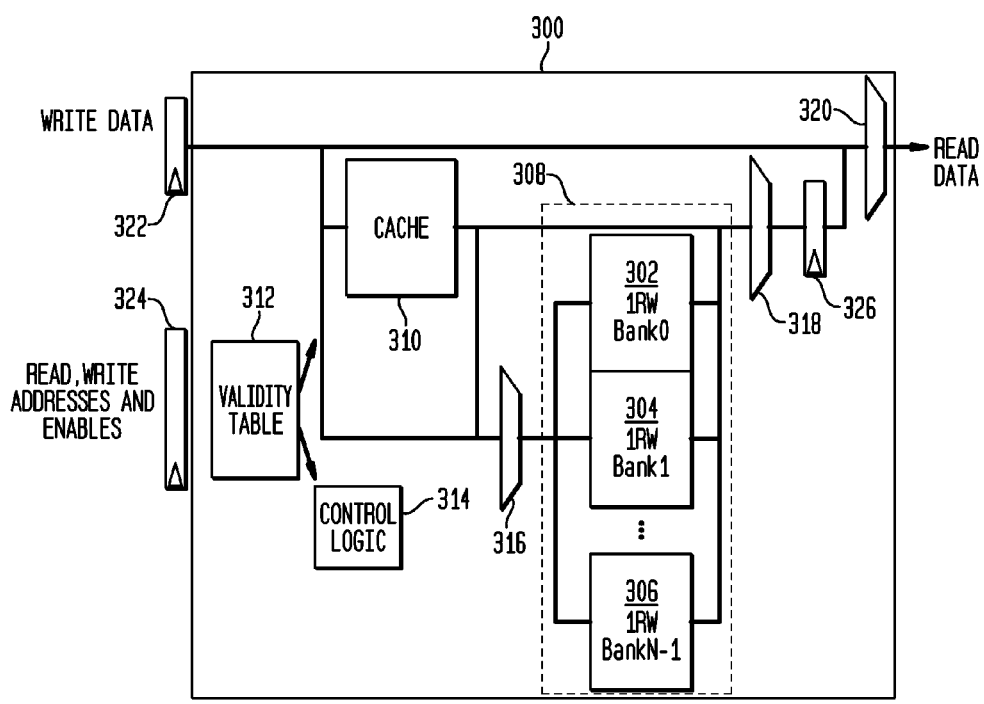
FIG. 3 is a block diagram depicting at least a portion of an exemplary multi-port memory, according to an embodiment of the invention.

FIG. 3 is a block diagram depicting at least a portion of an exemplary multi-port memory 300, according to an embodiment of the invention. Multi-port memory 300 includes a plurality of single-port (1RW) memory modules or banks, 302 (Bank 0), 304 (Bank 1), through 306 (Bank N−1), organized into an N-bank first memory array 308, which may be a multi-port main memory array (e.g., 1R1W RAM), where N is an integer greater than 1. The term "memory bank," which may be used herein synonymously with "memory module," as used herein is intended to refer broadly to essentially any organized grouping of storage elements, such as, for example, an array.

Each of at least a subset of the single-port memory modules 302, 304, 306, comprises a plurality of single-port memory cells (not explicitly shown) which may be implemented, for example, as a single-port (1RW) RAM or eDRAM (embedded dynamic random access memory) module. Memory 300 further includes a cache 310, operatively coupled with memory modules 302, 304 and 306, a second memory array 312, which may be referred to herein as a validity table, and control logic 314 operative to control one or more operations of the cache and/or the validity table. Memory 300 may include one or more multiplexers, 316, 318 and 320, operative to select one of a plurality of data paths in the memory 300 as a function of respective control signals supplied to the multiplexers.

One or more flip-flops 322, 324 and 326, or alternative storage elements, may be included in multi-port memory 300 for at least temporarily storing (e.g., latching) a logic state of an input signal supplied to the memory 300 and/or an output signal generated by the memory 300. Although inputs to the memory 300 are typically latched, and may therefore be provided directly to the memory, certain control paths in the memory may require additional latching capability. For example, write data supplied to multi-port memory 300 may be stored (i.e., latched) by flip-flop 322, read and write addresses, enable signals, etc., supplied to memory 300 may be stored by flip-flop 324, and data read from either the single-port memory array 308 or the cache 310 to be output by memory 300 (via multiplexer 320) may be stored by flip-flop 326.

Figure 4:
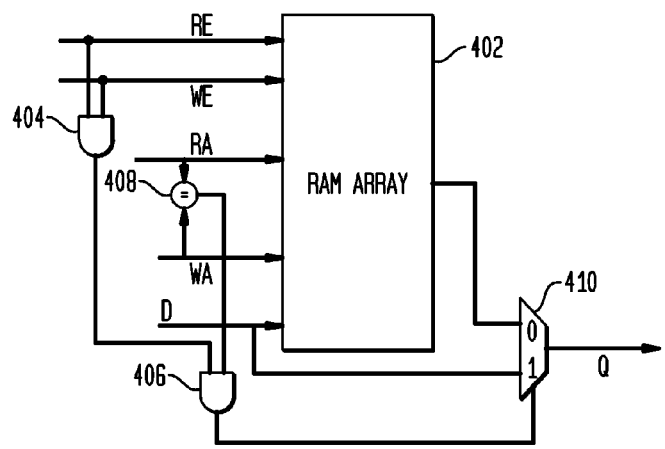
FIG. 4 is a top level block diagram depicting at least a portion of an exemplary memory circuit in which aspects of the present invention may be implemented.

FIG. 4 is a top level block diagram depicting at least a portion of an exemplary memory circuit 400 in which aspects of the invention may be implemented. Memory circuit 400 includes a RAM array 402 coupled with some external control logic for providing bypass support. Specifically, RAM array 402 is preferably adapted to receive several control signal, including, but not limited to, a read enable signal (RE), a write enable signal (WE), a read address (RA), a write address (WA), a data word (D) to be written into the RAM array at the supplied write address WA, and to output a data word (Q) read from the memory array at the supplied read address RA.

For RAM bypass support, memory circuit 400 includes a first logical AND gate 404 adapted to receive, at corresponding inputs thereof, the read and write enable signals, RE and WE, respectively. An output generated by AND gate 404 is provided to a first input of a second logical AND gate 406. Memory circuit 400 further includes a comparator 408 operative to receive at least a portion of the read and write addresses, RA and WA, respectively, and to generate a comparison signal indicating whether the read and write addresses are the same, as a result of the comparison operation. The comparison signal is provided to a second input of AND gate 406. An output generated by AND gate 406 is supplied to a control input of a multiplexer 410. Multiplexer 410 is operative to select which data path the output data word Q is read from.

More particularly, when the read and write enable signals are not both asserted (e.g., logic low or "0") at the same time, indicating that a read operation and write operation are not requested during the same memory cycle, AND gate 404 will generate a logic low (e.g., logic "0") output, thereby forcing AND gate 406 to generate a logic low output. With the control input of multiplexer 410 at a logic low level, the data path coupled with RAM array 402 will be selected, and therefore data word Q will be read from the RAM array. When read and write operations are requested during the same memory cycle, both RE and WE are asserted (e.g., logic high or "1"), thereby causing AND gate 404 to generate a logic high (e.g., logic "1") output. In this scenario, the output of AND gate 406 will be dependent upon the result of comparator 408. For example, when the read and write addresses are not the same (i.e., RA≠WA), comparator will generate a logic low comparison signal, thereby forcing AND gate 406 to generate a logic low output. However, when the read and write addresses are the same (i.e., RA=WA), the comparison signal be a logic high, thereby forcing AND gate 406 to generate a logic high output. With the control input of multiplexer 410 at a logic high level, the data path coupled directly with the input data word is selected, and therefore data word Q will be read as the input data word D to be written into RAM array 402.

Figure 5:
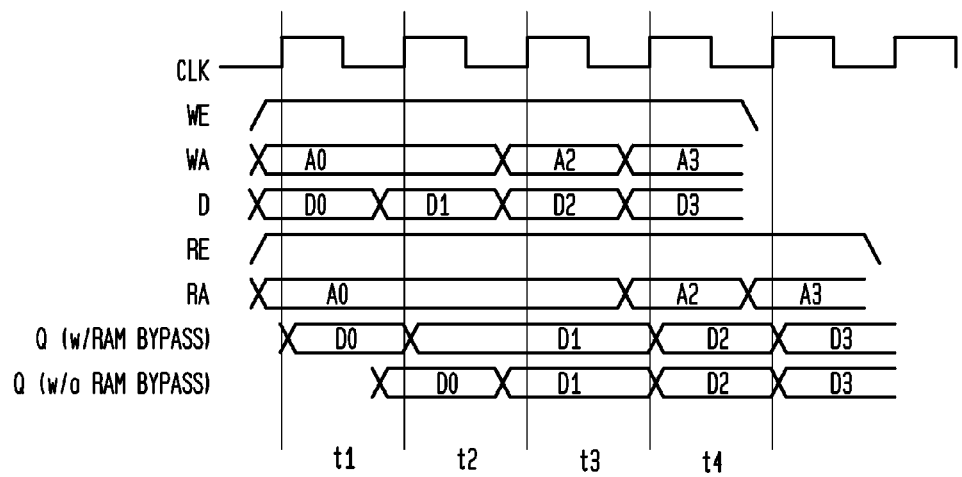
FIG. 5 is a graphical illustration depicting exemplary waveforms describing an operation of the memory circuit shown in FIG. 4 having bypass support compared to a memory circuit which does not provide bypass support.

FIG. 5 is a graphical illustration depicting exemplary waveforms 500 describing an operation of the memory circuit 400 shown in FIG. 4 with bypass support compared to a memory circuit which does not provide bypass support (bottom waveform). As apparent from FIG. 5, during a first memory cycle, t1, of the memory clock (CLK), both WE and RE are high and the read and write addresses RA and WA, respectively, are the same. Therefore, the output data word Q with RAM bypass support will be the same as the data word D to be written into the memory array (e.g., D0). Without bypass support, the output data word Q is undefined. During memory cycle t2, WE and RE remain asserted and RA and WA are the same. Therefore, the output data word Q with RAM bypass support will be the same as the data word D to be written into the memory array (e.g., D1). Without bypass support, the output data word Q is the previous data word (D0) written into the memory (i.e., the data word read output has not been updated). For the remaining memory cycles, t3 and t4, the read and write addresses are different, and thus no conflict occurs. In this instance, the data word Q read from address RA will be whatever is stored in the memory array, either with or without bypass support (since RA and WA are not the same, the bypass data path is not selected).

Figure 6:
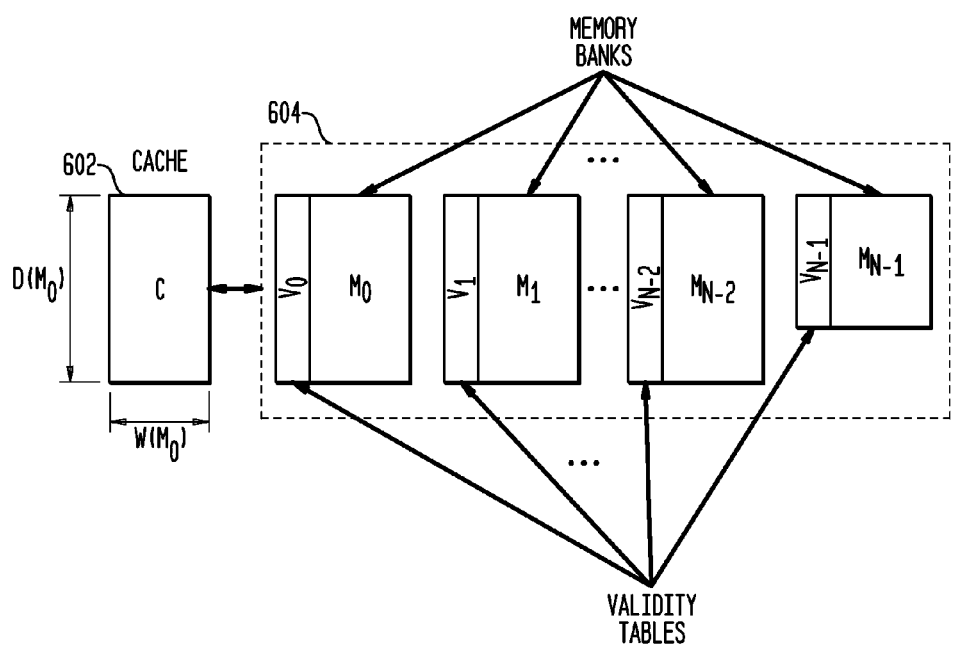
FIG. 6 is a block diagram illustrating at least a portion of an exemplary multi-port memory, according to an embodiment of the invention.

With reference now to FIG. 6, a block diagram illustrates at least a portion of an exemplary multi-port memory 600, according to an embodiment of the invention. Memory 600 includes a cache (C) 602 and a memory array 604 operatively coupled with the cache. Memory array 604 comprises N banks of single-port memory modules, $M_0, M_1, \ldots M_{N-2}$ and $M_{N-1}$, and N corresponding validity tables, $V_0, V_1, V_{N-2}$ and $V_{N-1}$, where N is an integer greater than 1. Although depicted in this embodiment as a plurality of separate validity tables, the validity tables may be collectively implemented as a single memory array, with each validity table having separate addressable space allocated to a corresponding one of the memory banks. The total number of words in memory array 604 will be at least equal to a prescribed address space, R, of the memory 600; the address space R is preferably no less than the total number of words of storage required.

Each given memory module is preferably organized as an array having a depth, D, defining the number of addressable words in the memory module, and having a width, W, defining the number of bits in a word in the memory module. The respective depths of the first N−1 single-port memory modules $M_0$ through $M_{N-2}$ are preferably the same relative to one another, although the invention is not limited to such a configuration. A depth of the last memory module $M_{N-1}$ (i.e., $D(M_{N-1})$) may be different (e.g., less) than the depths of the other memory modules, as may be required to divide the logical address space R among the plurality of physical memory modules.

There are essentially countless ways to divide the address space R among the memory modules $M_0$ through $M_{N-1}$. Consequently, it is to be understood that the respective depths of the memory modules need not be the same relative to one another; rather, each memory module may have a different depth associated therewith. It is preferable, however, for each memory module to have the same depth since a depth of the cache depth will be at least equal to the largest depth among the memory modules. In the interest of fast memory bank identification decoding, the most significant bits (MSBs) of the address can be used, or the least significant bits (LSBs) of the address can be used if N is power of two. FIG. 6 shows the MSB case. In this case the depth D is power of two. However, the address space R may not be divisible by D, so the depth of the last memory module $M_{N-1}$ will be the remainder. In any case, the invention is not intended to be limited to any specific distribution of the address space R among the plurality of memory modules. A depth of the cache 602 is preferably at least equal to a depth of a given one of the first N−1 memory modules (e.g., $D(C)=D(M_0)$), assuming the depths of the first N−1 memory modules are the same and the depth of the last memory module $M_{N-1}$ is less than the depths of any of the preceding memory modules. Moreover, a depth of each of the respective validity tables $V_0, V_1, V_{N-2}$ and $V_{N-1}$ is preferably equal to a depth of its corresponding memory module. For example, $D(V_0)=D(M_0)$, and $D(V_{N-1})=D(M_{N-1})$, etc.

The respective widths of the memory modules $M_0$ through $M_{N-1}$ are preferably the same relative to one another, although the invention is not limited to such a configuration. The width of the cache 602 is preferably at least equal to a width of a given one of the memory modules (e.g., $W(C)=W(M_0)$), although the invention is not limited to this configuration. For example, the width of the cache may be greater than the respective widths of the memory modules where error correction coding (ECC) is included in the cache (e.g., if the cache has a higher soft error rate than the data memory). Likewise, the width of the cache may be less than the respective widths of the memory modules where the data memory includes ECC and the cache does not. A width of each of the respective validity tables $V_0$ through $V_{N-1}$ is preferably one, although the invention is not limited to such an arrangement. $V_b$ may be defined herein as the validity table for memory bank b, and $V_b(a)$ may be defined herein as a binary value indicating a validity of the data word $M_b(a)$ at address offset a, where b∈{0, 1, ..., N−1}. Thus, in one embodiment, $V_b(a)$ being a logic high (e.g., "1") is indicative of word $M_b(a)$ being valid.

Figure 7:
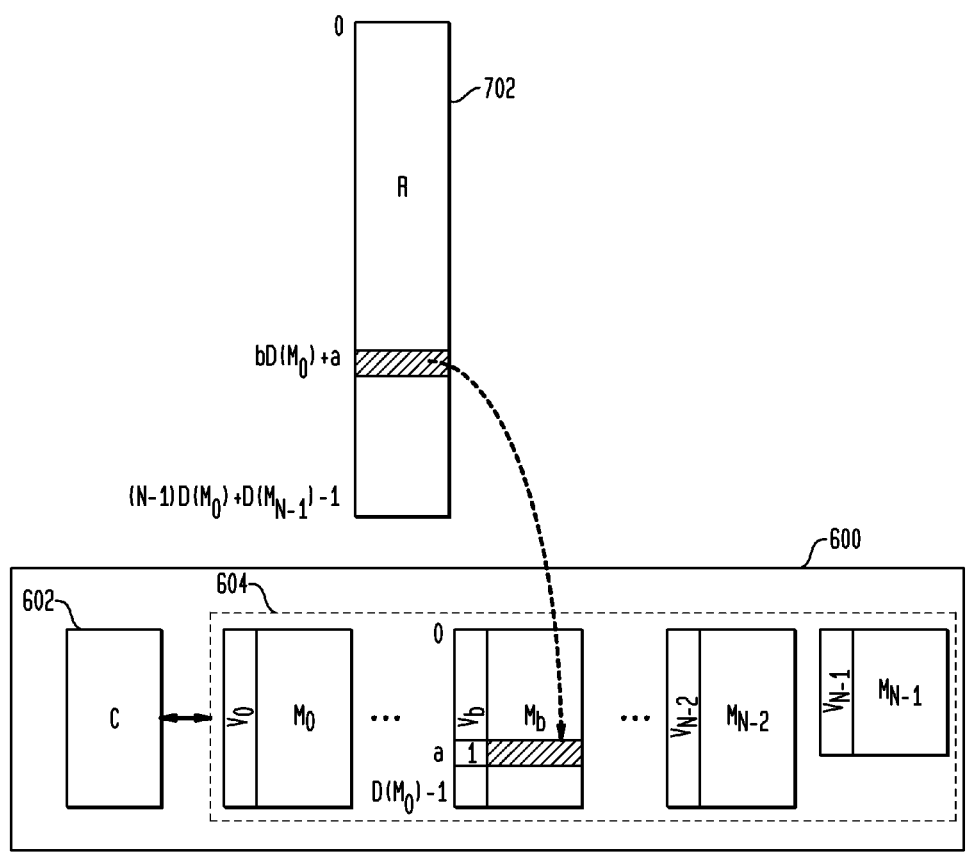
FIG. 7 is a conceptual depiction of an exemplary mapping of a logical address space R to physical data locations in the illustrative multi-port memory shown in FIG. 6, according to an embodiment of the invention.

FIG. 7 is a conceptual depiction of an exemplary mapping of an address space R to data locations in the illustrative multi-port memory 600 shown in FIG. 6, according to an embodiment of the invention. It is to be understood that the mapping shown herein is by way of illustration only and without loss of generality. Address space R preferably represents all accessible storage locations of a monolithic multi-port memory (e.g., 1R1W memory) implemented by multi-port memory 600. Thus, with reference to FIG. 7, address space R can be represented as a single storage element 702 having a depth (i.e., number of storage locations) equal to a sum of the address locations of each of the individual memory banks $M_0$ through $M_{N-1}$, such that $D(R)=(N-1)D(M_0)+D(M_{N-1})$, where D(R) is the depth of address space R, $D(M_0)$ is the depth of the first N−1 memory banks, $M_0$ through $M_{N-2}$, in memory array 604, and $D(M_{N-1})$ is the depth of the last memory bank $M_{N-1}$ in the memory array. A width of the address space R is preferably equal to the number of bits in the address a plus a prescribed number of bits, b, used to select a given one of the memory banks in memory array 604. A logical address R(x) is therefore comprised of a memory bank (i.e., segment) selector portion, which may include a prescribed number of most significant bits (MSBs) of the address, and an offset portion, which may include the remaining least significant bits (LSBs) of the address. Alternative address assignments are similarly contemplated.

When the validity table entry corresponding to an address a in a given memory bank b in memory array 604 indicates that the data stored therein is valid (e.g., $V_b(a)=1$), the word at address R(x) in the logical address space R will be stored at physical address $a=\text{Offset}(x, D(M_0))$ of memory bank $b=\text{Bank}(x, D(M_0))$ (i.e., $M_b(a)$). In this logical-to-physical mapping definition, $\text{Offset}(x,y)=x \bmod y$ and $\text{Bank}(x,y)=\lfloor x/y \rfloor$, where $\lfloor x/y \rfloor$ is referred to herein as a "floor" or "round down" function which returns the integer part of the division x/y. Preferably, there is a 1:1 correspondence between the logical memory 702 and the physical memory 600; in other words, every address location in the logical address space R is mapped to a corresponding physical location in the memory array 604 (e.g., memory banks $M_0$ through $M_{N-1}$). This approach greatly simplifies the mapping process and essentially eliminates the need for a memory mapping unit (MMU) and/or complex control logic.

Figure 8:
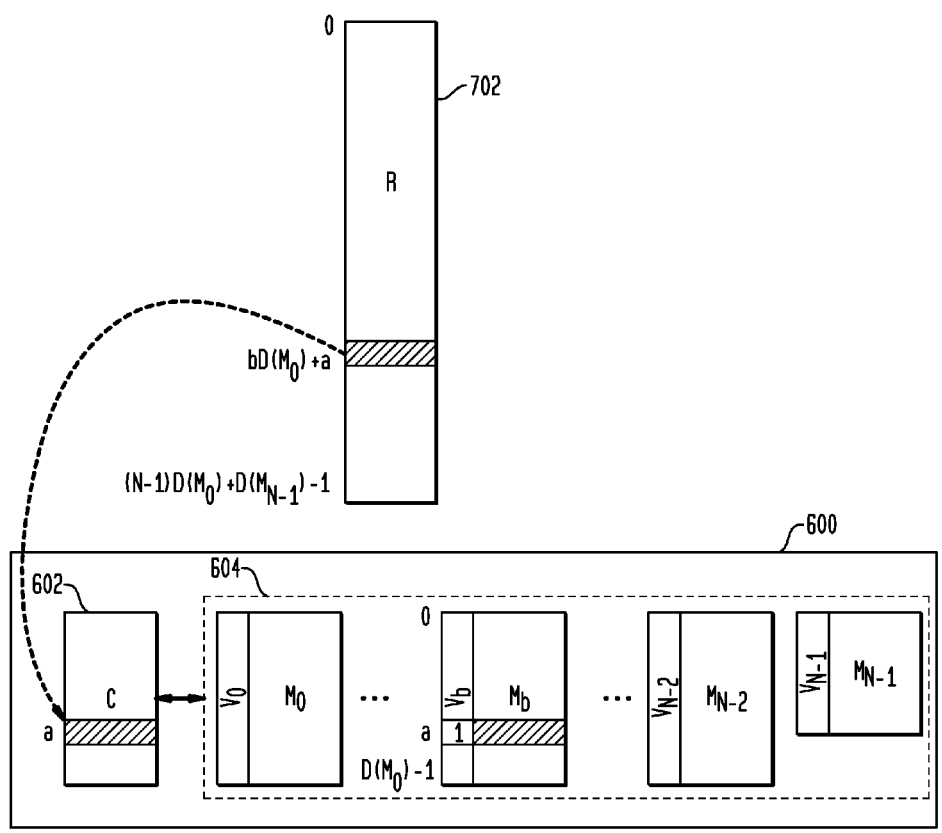
FIG. 8 is a conceptual depiction of an exemplary mapping of a logical address space R to physical data locations in the illustrative multi-port memory shown in FIG. 6 using a cache, according to an embodiment of the invention.

Conversely, when the validity table entry corresponding to address a in memory bank b in memory array 604 indicates that the data stored therein is invalid (e.g., $V_b(a)=0$), the word at address R(x) in the logical address space R will be stored in the cache 602. This exemplary scenario is conceptually illustrated in FIG. 8. With reference to FIG. 8, the entry in validity table $V_b$ corresponding to memory bank b (i.e., $M_b$) at address a is a logic "0," indicating that the data stored at address a in $M_b$ is invalid. Consequently, this would imply that the word at address R(x) in logical memory 702 will be stored in the cache 602 at address a. Since cache 602 is shared by all N memory banks $M_0$ through $M_{N-1}$ in memory array 604, thus representing an N:1 mapping correspondence between the memory array and the cache, a control methodology is preferably implemented to transfer the data stored in the cache into its corresponding location in the memory array. Without such a control methodology, there is a risk that the data stored at address a in cache 602 could be overwritten when data corresponding to the same address of a different memory bank is to be written into the cache.

By way of example only and without loss of generality, an illustrative methodology for controlling how data is stored in the multi-port memory 600 will now be described in further detail. The control methodology may be implemented, for example, in control logic (e.g., control logic 314 in FIG. 3) included in the memory. Throughout the description herein, certain shorthand, conventions and/or terms may be used, merely for convenience, although it is to be understood that the invention is not limited to such shorthand, conventions and/or terms.

For the following description, let a write address ($a_w$) be defined as Offset($A_w$, $D(M_0)$), a read address ($a_r$) be defined as Offset($A_r$, $D(M_0)$), a memory bank to be written ($b_w$) be defined as Bank($A_w$, $D(M_0)$), and a memory bank to be read ($b_r$) be defined as Bank($A_r$, $D(M_0)$), where Offset(x, y) and Bank(x, y) are logical-to-physical address mapping functions, $A_w$ is the write address of the logical multi-port memory, which is valid only when the write enable $E_w$ to the physical memory is asserted (e.g., logic "1"), and $A_r$ is the read address of the logical multi-port memory, which is valid only when a read enable $E_r$ to the physical memory is asserted (e.g., logic "1"). As a result, $A_w=b_w D(M_0)+a_w$, and $A_r=b_r D(M_0)+a_r$. The terms $A_w$ and $A_r$ as used herein correspond to the logical address space R, and the terms $a_w$, $a_r$, $b_w$ and $b_r$ as used herein correspond to the physical memory $M_0$ through $M_{N-1}$. The term $D(M0)$ as used herein refers to the depth of memory modules $M_0$ through $M_{N-2}$, which are all assumed to be the same in this example.

A logical write request, or simply a "write request," of a value d to a write address A, in the logical memory space R may be defined as Write(R($A_w$), d). By definition, write enable signal $E_w$ is asserted (e.g., $E_w$=1) on a write request. Similarly, a logical read request, or simply a "read request," from a read address $A_r$ in the logical memory space R can be defined as Read(R(Ar)). By definition, read enable signal $E_r$ is asserted (e.g., $E_r$=1) on a read request. A word that logically resides in memory space R(A) is physically stored at address a in a corresponding memory bank b (i.e., $M_b(a)$) or in the cache C (i.e., C(a)).

The set of all legal bank-offset pairs may be defined as the set $\{(b, a)\} \cup \{(N-1, a')\}$, where b is indicative of a given one of the first N−1 memory banks, such that b∈$\{0, 1, \ldots, N-2\}$, a is an address of a given one of the first N−1 memory banks, such that a∈$\{0, 1, \ldots, D(M_0)-1\}$, and a' is an address of the last memory bank ($M_{N-1}$), such that a'∈$\{0, 1, \ldots, D(M_{N-1})-1\}$. The state of the physical multi-port memory 600 preferably takes into account the set of values in the memory banks $M_b(a)$ and corresponding validity tables $V_b(a)$ in memory array 604 for all legal bank-offset pairs (b, a), and the values $C(a_c)$ in cache 602, for all addresses $a_c$∈$\{0, 1, \ldots, D(M_0)-1\}$. When a memory bank to be written to is the same as a memory bank to be read from (e.g., $b_w=b_r$) and the read and write enable signals are both asserted (e.g., $E_w=E_r=1$), a collision is said to occur. A path p in a directed graph G is denoted as p=$\langle v_0, v_1, v_k \rangle$, where $v_i$, i∈$\{0, 1, \ldots, k\}$ is a vertex in G and $v_0$ is the first vertex in the path, $v_1$ the next vertex, and so on until $v_k$.

An objective of the control methodology is to emulate a multi-port RAM. The control methodology, according to an embodiment of the invention, translates logical read and write requests of the multi-port memory instance into physical reads and writes, respectively, of the internal single-port memory banks and corresponding validity tables in the memory array 604 and cache 602. Unlike a processor cache, however, latency in memory 600 should be independent of the state of the cache.

An illustrative control methodology according to an embodiment of the invention is described below for various prescribed scenarios, including, for example, different values of the read and write enable signals, read and write addresses, and validity tables. In each case, there is a set of corresponding actions taken regarding the read and write ports of the cache, the internal single-port memory banks and corresponding validity tables, and when unspecified, these ports are assumed to be inactive. A read request Read(R($A_r$)) and a write request Write(R($A_w$), d) are considered in the following cases, wherein a left arrow (←) denotes a synchronous assignment. For instance, q←d represents that signal q will have the value d after the next rising clock edge. Moreover, all statements separated by a comma are defined as occurring in the same clock cycle.

In an initialization case (Case 0), all validity table entries $V_b(a)$ for all legal bank-offset pairs (b, a) are preferably set to a logic high ("1") value. Like a monolithic multi-port RAM (e.g., 1R1W RAM), the read value from R($A_r$) will be arbitrary (i.e., undefined) if R($A_w$) has not been assigned a value since initialization.

In an idle case (Case 1), read and write enable signals are de-asserted (e.g., $E_r=E_w=0$). In this case, the state of the multi-port memory 600 remains unchanged from the previous clock cycle.

In a write-only case (Case 2), the write enable signal is asserted (e.g., $E_w$=1) and the read enable signal is de-asserted (e.g., $E_r$=0). In this case, a memory bank $b_w$ designated by the write address $a_w$ is selected for writing, and the storage location $M_{b_w}(a_w)$ will take on the value d after the next rising clock edge (i.e., $M_{b_w}(a_w)$←d). During the same cycle, the corresponding validity table is updated to reflect that the data stored at that address is valid (i.e., $V_{b_w}(a_w)$←1).

In a read-only case wherein data is read from the cache (Case 3), the read enable signal is asserted (e.g., $E_r$=1) and the write enable signal is de-asserted (e.g., $E_w$=0). In this case, a validity table corresponding to a memory bank $b_r$ designated by the read address $a_r$ (i.e., $V_{b_r}(a_r)$) indicates that the data stored at address $a_r$ in memory bank $b_r$ is invalid (e.g., $V_{b_r}(a_r)$=0). Since data cannot be read from the memory bank, the data is read from the cache at address $a_r$, such that a signal q will take on the value of the cache C at address $a_r$ after the next rising clock edge (i.e., q←$C(a_r)$).

In a read-only case wherein data is read from the memory bank (Case 4), the read enable signal is asserted (e.g., $E_r$=1) and the write enable signal is de-asserted (e.g., $E_w$=0), as for Case 3. In this case, however, the validity table corresponding to memory bank $b_r$ designated by the read address $a_r$ (i.e., $V_{b_r}(a_r)$) indicates that the data stored at address $a_r$ in memory bank $b_r$ is valid (e.g., $V_{b_r}(a_r)$=1). Thus, data is read from the memory bank $b_r$ at read address ar, such that signal q will take on the value of the designated memory bank $M_{b_r}$ at address $a_r$ after the next rising clock edge (i.e., q←$M_{b_r}(a_r)$).

In a case where reading and writing of different internal memory banks is requested during the same memory cycle (Case 5), read and write enable signals are both asserted (e.g., $E_r=E_w$=1), and the designated read memory bank $b_r$ is different than the designated write memory bank $b_w$ (i.e., $b_r \ne b_w$). In this case, where the validity table corresponding to the memory bank $b_r$ designated by the read address $a_r$ (i.e., $V_{b_r}$ ($a_r$)) indicates that the data stored at address $a_r$ in memory bank $b_r$ is invalid (e.g., $V_{b_r}(a_r)=0$), data cannot be read from the memory bank but, rather, is read from the cache at address $a_r$, such that a signal q will take on the value of the cache C at address $a_r$ after the next rising clock edge (i.e., $q \leftarrow C(a_r)$). Concurrently, or substantially concurrently, a memory bank $b_w$ designated by the write address $a_w$ is selected for writing, and the storage location $M_{b_w}(a_w)$ will take on the value of data word d to be written after the next rising clock edge (i.e., $M_{b_w}(a_w) \leftarrow d$). During the same memory cycle, the corresponding validity table is updated to reflect that the data stored at that address is valid (e.g., $V_{b_w}(a_w) \leftarrow 1$).

Where the validity table corresponding to the memory bank $b_r$ designated by the read address $a_r$ (i.e., $V_{b_r}(a_r)$) indicates that the data stored at address $a_r$ in memory bank $b_r$ is valid (e.g., $V_{b_r}(a_r)=1$), data is read from that memory bank, such that a signal q will take on the value of the memory bank $M_{b_r}$ at address $a_r$ after the next rising clock edge (i.e., $q \leftarrow M_{b_r}(a_r)$). The write operation, which occurs concurrently (or substantially concurrently) with the read operation, will be the same as described above. Specifically, the memory bank $b_w$ designated by the write address $a_w$ is selected for writing, and the storage location $M_{b_w}(a_w)$ will take on the value d to be written after the next rising clock edge (i.e., $M_{b_w}(a_w) \leftarrow d$). During the same memory cycle, the corresponding validity table is updated to reflect that the data stored at that address is valid (e.g., $V_{b_w}(a_w) \leftarrow 1$).

In a case where reading and writing of the same memory bank is requested during the same memory cycle (Case 6), read and write enable signals are both asserted (e.g., $E_r = E_w = 1$), as in Case 5, but the designated read memory bank $b_r$ designated by the read address $a_r$ is the same as the designated write memory bank $b_w$ designated by the write address $a_w$ (i.e., $b_r = b_w = b$, where b is a given memory bank).

Where the read and write addresses $a_r$ and $a_w$, respectively, are not the same (i.e., $a_w \neq a_r$) and the validity table corresponding to memory bank b (i.e., $V_b(a_r)$) indicates that the data stored at address $a_r$ in memory bank b is invalid (e.g., $V_b(a_r)=0$), referred to herein as Case 6a, the requested data resides in the cache at address $a_r$, such that signal q will take on the value of the cache C at address $a_r$ after the next rising clock edge (i.e., $q \leftarrow C(a_r)$). Under this scenario, the sole port of memory bank b, being a single-port (1RW) RAM, is available for writing while the cache is being read. Hence, concurrently (or substantially concurrently) memory bank b designated by the write address $a_w$ is selected for writing, and the storage location $M_b(a_w)$ will take on the value of data word d to be written after the next rising clock edge (i.e., $M_b(a_w) \leftarrow d$). During the same memory cycle, the corresponding validity table is updated to reflect that the data stored at that address $a_w$ is valid (e.g., $V_b(a_w) \leftarrow 1$).

Where, in Case 6, the read and write addresses $a_r$ and $a_w$, respectively, are not the same (i.e., $a_w \neq a_r$) and the validity table corresponding to memory bank b (i.e., $V_b(a_r)$) indicates that the data stored at address $a_r$ in memory bank b is valid (e.g., $V_b(a_r)=1$), referred to herein as Case 6b, the requested data resides in the memory bank b, such that signal q will take on the value of memory bank b at address $a_r$ after the next rising clock edge (i.e., $q \leftarrow M_b(a_r)$). Since the sole port of the single-port memory bank b is busy serving the read request, the write operation is directed to the cache for storing data word d at address $a_w$ (i.e., $C(a_w) \leftarrow d$).

However, if the cache at address $a_w$ is holding data d' for some other memory bank b', where $b' \neq b$, then the data d' must first be transferred to an alternative storage location. If the validity table entry corresponding to bank b' at address $a_w$ indicates that the data stored at address $a_w$ of memory bank b' is invalid (e.g., $V_{b'}(a_w)=0$), then the data stored in the cache at address $a_w$ can be transferred (i.e., written) into address $a_w$ in memory bank b' before the cache is overwritten with data word d (i.e., $M_{b'}(a_w) \leftarrow d'$; then $C(a_w) \leftarrow d$). Alternatively, if the validity table corresponding to address $a_w$ in memory bank b' indicates that the data stored at that location is valid (e.g., $V_{b'}(a_w)=1$), the data d' stored in the cache at address $a_w$ is no longer need and can therefore be overwritten with new data d. This can be implemented, for example, as part of a cache management policy, according to aspects of the invention.

Once the cache data is written into memory bank b', the validity table corresponding to bank b' at address $a_w$ is preferably updated to indicate that the data stored at that location is valid (e.g., $V_{b'}(a_w) \leftarrow 1$). Note, that all assignments occur in the same clock cycle, thereby avoiding any latency penalty. The cache (e.g., 602) in memory 600 in this instance is preferably implemented using a single-port read, single-port write (1R1W) RAM, since the cache C at address $a_w$ is both written into and read from in the same clock cycle. Cache 602 preferably does not support write-through, since a cache read preferably occurs after a cache write. During the same clock cycle, the validity table corresponding to memory bank b is also updated to indicate that the data stored at address $a_w$ is invalid (e.g., $V_b(a_w) \leftarrow 0$), since this data d was written into the cache rather than into memory bank b (i.e., $M_b(a_w)$).

With regard to the validity tables corresponding to the memory banks (e.g., validity tables $V_b$ and $V_{b'}$ corresponding to memory banks b and b', respectively), if the validity tables are implemented as a single RAM, then the validity tables are preferably implemented using a dual-port read, single-port write memory (e.g., 2R1W RAM), since there may be up to two read addresses, $a_w$ and $a_r$, and one write address, $a_w$, during the same clock cycle. Alternatively, if the validity tables are implemented as a separate memory element for each memory bank, then the validity tables may be implemented using a single-port read, single-port write memory (e.g., 1R1W RAM).

Where, in Case 6, the read and write addresses $a_r$ and $a_w$, respectively, are the same (i.e., $a_w = a_r = a$) and the validity table corresponding to memory bank b (i.e., $V_b(a_r)$) indicates that the data stored at address a in memory bank b is invalid (e.g., $V_b(a)=0$), referred to herein as Case 6c, the requested data resides in the cache at address a, such that signal q will take on the value of the cache C at address a after the next rising clock edge (i.e., $q \leftarrow C(a)$). Alternatively, if RAM bypass is supported in memory 600, the memory data input path is also routed to the output, bypassing the internal memory modules; thus signal q will take on the value of the data d to be written into memory array 604 (i.e., $q \leftarrow d$). Under this scenario, the sole port of memory bank b, being a single-port (1RW) RAM, is available for writing concurrently while the read operation is being serviced. Hence, concurrently (or substantially concurrently) memory bank b designated by address a is selected for writing, and the storage location $M_b(a)$ will take on the value of data word d to be written after the next rising clock edge (i.e., $M_b(a) \leftarrow d$). During the same memory cycle, the corresponding validity table is updated to reflect that the data stored at that address a is valid (e.g., $V_b(a) \leftarrow 1$).

Where, in Case 6, the read and write addresses $a_r$ and $a_w$, respectively, are the same (i.e., $a_w = a_r = a$) and the validity table corresponding to memory bank b (i.e., $V_b(a_r)$) indicates that the data stored at address a in memory bank b is valid (e.g., $V_b(a_r)=1$), referred to herein as Case 6d, the requested data to be read from the memory 600 resides in the memory bank b, such that signal q will take on the value of memory bank b at address a after the next rising clock edge (i.e., $q \leftarrow M_b(a)$), assuming memory bypass is not supported. In this instance, since the sole port of the single-port memory bank b is busy serving the read request, the write operation is directed to the cache for storing data word d at address a (i.e., $C(a) \leftarrow d$).

However, if the cache at address a is holding data d' for some other memory bank b', where b'≠b, then the data d' in the cache must first be transferred to an alternative storage location. If there is a validity table entry corresponding to a bank b' at address a indicating that the data stored at address a of memory bank b' is invalid (e.g., $V_{b'}(a)=0$), then the data stored in the cache at address a can be transferred (i.e., written) into address a in memory bank b' before the cache is overwritten with data word d (i.e., $M_{b'}(a) \leftarrow d'$; then $C(a) \leftarrow d$). These steps can be performed concurrently if the cache memory supports that. Alternatively, if all validity tables corresponding to address a in all memory banks indicate that the data stored at those locations are valid (e.g., $V_0(a)=V_1(a)=\ldots=V_{n-1}(a)=1$), then the data d' stored in the cache at address a is simply discarded and overwritten with new data d. This can be implemented, for example, as part of a cache replacement policy.

Once the cache data is written into memory bank b', the validity table corresponding to bank b' at address a is preferably updated to indicate that the data stored at that location is valid (e.g., $V_{b'}(a) \leftarrow 1$). Note, that all assignments occur in the same clock cycle, thereby avoiding any latency penalty. As previously stated, the cache (e.g., 602) in memory 600 in this instance is preferably implemented using a single-port read, single-port write (1R1W) RAM, since the cache C at address a is both written into and read from in the same clock cycle. During the same clock cycle, the validity table corresponding to memory bank b is also updated to indicate that the data stored at address a is invalid (e.g., $V_b(a) \leftarrow 0$), since this data d was written into the cache rather than into memory bank b (i.e., $M_b(a)$).

Alternatively, if memory bypass is supported, the sole port of bank b is used for writing, since the data input path is preferably routed to the output, thereby bypassing the internal memory banks; signal q will take on the value of the data d to be written into memory array 604 (i.e., $q \leftarrow d$). Hence, concurrently (or substantially concurrently) memory bank b designated by address a is selected for writing, and the storage location $M_b(a)$ will take on the value of data word d to be written after the next rising clock edge (i.e., $M_b(a) \leftarrow d$). During the same memory cycle, the corresponding validity table is updated to reflect that the data stored at that address a is valid (e.g., $V_b(a) \leftarrow 1$).

In order to implement a multi-port memory (e.g., two-port (1R1W) memory), whatever is written into a particular memory address can be read from the same address during the same clock cycle. It can be shown that the exemplary memory architecture described herein above is able to provide such functionality. By way of example only, several properties inherent in the exemplary multi-port memory architecture according to an embodiment of the invention are presented below, along with corresponding proofs confirming that the respective properties hold.

Property 1: $M_b(a)$ is assigned a value for any legal bank-offset pair (b, a) if and only if $V_b(a)$ is assigned the value 1 in the same clock cycle.

Proof: The only cases in which $M_b(a)$ is assigned a value are Cases 2, 5 and 6 above, wherein each assignment of $M_b(a)$ is paired with $V_b(a)$ being assigned a value of 1 in the same cycle.

Property 2: The array $(V_0(a), V_1(a), \ldots V_{N-2}(a))$ has at most one 0 for any $a \in \{0, 1, D(M_0)-1\}$, and the array $(V_0(a'), V_1(a'), \ldots V_{N-1}(a'))$ has at most one 0 for any $a' \in \{0, 1, \ldots, D(M_{N-1})-1\}$.

Proof: Upon initialization, all validity table entries are assigned a value of 1. A validity table entry can be assigned a value of 0 only when the cache is written; i.e., in Case 6d, when the read and write addresses $a_r$ and $a_w$, respectively, are the same (i.e., $a_w=a_r=a$) and the validity table corresponding to memory bank b (i.e., $V_b(a_r)$) indicates that the data stored at address a in memory bank b is valid (e.g., $V_b(a_r)=1$), when memory bypass is not supported, and in Case 6b, when the read and write addresses the read and write addresses $a_r$ and $a_w$, respectively, are not the same and the validity table corresponding to memory bank b (i.e., $V_b(a_r)$) indicates that the data stored at address a in memory bank b is valid (e.g., $V_b(a_r)=1$). In both cases, exactly one validity table entry can be assigned a value of 0 in any given clock cycle. Let (b, a) and (b', a), b≠b', be two legal bank-offset pairs. Now suppose that Property 2 is not true. Then there must be some clock cycle in which a validity table entry $V_b(a)$ is assigned the value 0 while the validity table $V_{b'}(a)$ in some other memory bank b' maintains the value 0 into the next cycle. This a contradiction, however, since the action of assigning the value 0 to the validity table in both Case 6b and Case 6d assigns the value 1 to $V_{b'}(a)$. Property 2 must therefore be valid.

Property 3: Once $M_b(a_w)$ is assigned the d on the write request $Write(A_w, d)$, provided that there is no subsequent write request to $R(A_w)$, there is no subsequent assignment to $M_b(a_w)$.

Proof: $M_b(a_w)$, where $b=b_w$, is assigned the value d on the write request $Write(A_w,$ only in Cases 2, 5, 6a, 6c and 6d (when memory bypass is supported). Since there is no subsequent write request to $R(A_w)$, there is no subsequent assignment to $M_b(a_w)$ in these cases. These cases include all write cases except Case 6b and Case 6d (when memory bypass is not supported), which in turn are the only other cases in the illustrative control methodology wherein a memory bank entry may be assigned a value. This property is proved once it is shown that Cases 6b and 6d (without memory bypass support) do not assign a value to $M_b(a_w)$.

To show this, assume that in Cases 6b and 6d (without memory bypass support) do assign a value to $M_b(a_w)$. Then both of the following must be true:

1. The memory bank assignment in Case 6b, namely, $M_{b'}(a_w) \leftarrow C(a_w)$, assigns a value to $M_b(a_w)$. This implies that b'=b, which is a contradiction to the condition in Case 6b that b'≠b.

2. The memory bank assignment in Case 6d, $V_b(a)=0$, (without memory bypass support), namely, $M_{b'}(a) \leftarrow C(a)$, assigns a value to $M_b(a_w)$. This implies that b'=b, a contradiction to the condition in Cased 6d that b'≠b.

Property 4: $C(a_w)$ is assigned a value if and only if $V_b(a_w)$ is assigned the value 0 for some $b \in \{0, 1, \ldots, N-1\}$ in the same cycle.

Proof: See Cases 6b and 6d (without memory bypass support) above, particularly for actions $C(a_w) \leftarrow d$ and $V_b(a_w) \leftarrow 0$.

Property 5: Once $C(a_w)$ is assigned a value on the write request $Write(A_w, d)$, there is no subsequent assignment to $C(a_w)$ and no subsequent assignment to $V_b(a_w)$, where $b \in \{0, 1, \ldots, N-1\}$, if and only if there is no subsequent write request to $R(bD(M_0)+a_w)$.

Proof: Sufficiency—Suppose the contrary to Property 5 is true. An assignment to $C(a_w)$ occurs only during the action $C(a_w) \leftarrow d$ in Cases 6b and 6d (without memory bypass support). In both cases, there is a write request $R(bD(M_0)+a_w)$ for $b \in \{0, 1, \ldots, N-1\}$, which represents a contradiction. Furthermore, an assignment to $V_b(a_w)$ occurs only (1) in those cases covered by Property 1, where there is a write request $Write(A_w, d)$ for some d', and (2) in Case 6b and Case 6d

(without memory bypass support), all of which involve a write request to R(bD($M_0$)+$a_w$) for b∈{0, 1, ..., N−1}, again a contradiction.

Necessity—Suppose the contrary to Property 5 is true. A write request to R(bD($M_0$)+$a_w$), where b∈{0, 1, ..., N−1}, assigns a value to $V_b(a_w)$ according to the control methodology, which is a contradiction.

Property 6: Data is transferred from C(a) to $M_b$(a) only on a write request Write(bD($M_0$)+a), for some b'≠b, where $V_{b'}$(a)=0 and $V_b$(a)=1.

Proof: See the action $V_b$(a)=0 for some b'≠b if and only if $M_b$(a)←C(a) and $V_b$(a)←1 in Cases 6b and 6d (without memory bypass support).

Property 7: If memory bypass is supported, the read request Read($A_w$) accompanied by a write request Write($A_w$, d) in the same clock cycle returns d.

Proof: See the action q←d in Cases 6c and 6d above (with memory bypass support).

Property 8: The write request Write($A_w$, d) followed by the read request Read($A_w$) in a later cycle, with no intervening write requests Write($A_w$, d'), where d'≠d, returns the value d.

Figure 9:
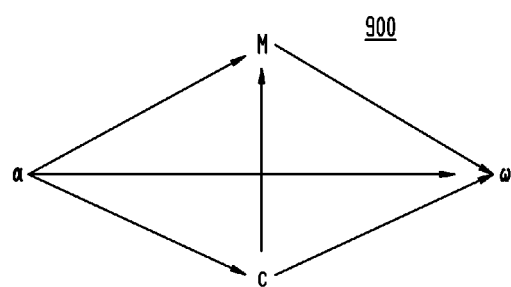
FIG. 9 is a data flow diagram corresponding to an exemplary control methodology, according to an embodiment of the invention.

Proof: Assume the illustrative control methodology described above has an exemplary data flow graph 900 as shown in FIG. 9, which is also a directed acyclic graph with a root labeled α. In this scenario, there are exactly four paths for an input word from α to reach the memory read output ω, namely, a direct path from α to ω when memory bypass is supported, and via the cache C and/or one of the memory banks M∈{$M_0$, $M_1$, $M_{N-1}$}. Here, all valid memory states have been considered except the validity tables. Since validity table entries are assigned either a constant value of 0 or 1, as opposed to a value from another state, the validity tables need not be considered explicitly in the data flow graph 900.

Note, with reference to FIG. 9, that there is no data flow between memory banks M in the exemplary control methodology. In any cycle, at most one memory bank is written, and at most one other memory is read. Among the four paths, only three apply to this property, as will be described in further detail below. For each of the three applicable paths, it can be shown that the read request returns the value d.

1. Path $p_1$=⟨α, ω⟩

This path does not apply to Property 8 since this property concerns a read request that follows a write request, as opposed to the two occurring in the same clock cycle. This path is discussed in Property 7 above.

2. Path $p_2$=⟨α, M, ω⟩

The path from α to M=$M_{b_w}$ applies to Cases 2, 5, 6a, 6c and 6d (with memory bypass support) above; i.e., all write cases except Case 6b and 6d (without memory bypass support). Since there is no intervening write request Write($A_w$, d') where d'≠d, by Property 3 above, the entry $M_{b_w}(a_w)$ continues to hold the value d. By Property 1 above, $V_{b_w}(a_w)$=1 and continues to hold this value. As a result, only Cases 4, 5 (where the validity table $V_{b_r}(a_r)$=1), 6b and 6d (without memory bypass support) apply and the read request returns $M_{b_w}(a_w)$, which is the value d.

3. Path $p_3$=⟨α, C, ω⟩

The path from α to C along $p_3$ only applies to the write request in Cases 6b and 6d (without memory bypass support). In both cases, C($a_w$) is assigned the value d, and $V_b(a_w)$ is assigned the value 0 due to the write request Write($A_w$, d). Given path $p_3$ with no intervening write request Write($A_w$, d'), where d'≠d, $V_b(a_w)$ remains 0 and C($a_w$) continues to hold the value d. It follows that the read request Read($A_w$) returns d, according to Cases 3, 5, 6a and 6d (without memory bypass support).

Now suppose the contrary is true. This implies that $V_{b_w}(a_w)$ is assigned the value 1, which in turn implies one of the following:

a. One of the following actions is taken: $V_{b_w}(a_w)$←1 in Cases 2, 5, 6a, 6b and 6d (with memory bypass support). In these cases, there is either an intervening write request Write($A_w$, d') where d'≠d, leading to a contradiction, or an intervening write request Write($A_w$, d), leading to the assignment of the value 1 to $V_{b_w}(a_w)$. A subsequent read request Read($A_w$) may therefore read the required data from $M_{b_w}(a_w)$, a contradiction to the assumption that $p_3$ does not include the path ⟨M, ω⟩.

b. The action $V_b(a_w)$=0 for some b'≠b, if and only if $M_{b'}(a_w)$←C($a_w$) and $V_b(a_w)$←1 in Cases 6b and 6d (without memory bypass support). This implies that the path ⟨C, M⟩ is taken, a contradiction to the assumption that path $p_3$ is taken.

Again, making the contrary assumption that $V_{b_w}(a_w)$ is assigned the value 1 implies that path $p_3$ is taken, but C($a_w$) is assigned some value d'≠d. According to the exemplary control methodology, the action C($a_w$)←d in Cases 6b or 6d (without memory bypass support) is taken. Thus, there is an intervening write request Write(bD($M_0$)+$a_w$) for some legal bank-offset pair (b, $a_w$). Suppose b=$b_w$. This leads to a contradiction to the assumption that there is no intervening write request to A, with data other than d. Therefore, it must be the case that b $b_w$. However, since $V_{b_w}(a_w)$=0 based on an earlier assumption, the action $V_b(a_w)$=0 for some b'≠b, if and only if $M_b(a_w)$←C($a_w$) and $V_b(a_w)$←1 in Cases 6b and 6d (without memory bypass support) must be taken. Hence, it follows that there is a path from C to M, which is a contradiction to path $p_3$.

4. Path $p_4$=⟨α, C, M, ω⟩

The path from α to C along $p_4$ only applies to the write request in Cases 6b and 6d (without memory bypass support). In both cases, C($a_w$) is assigned the value d from the write request Write($A_w$, d), and $V_b(a_w)$ is assigned the value 0. Because data transfer occurs from C($a_w$) to $M_b(a_w)$ along path p4, by Property 6 there must be an intervening write request Write(bD($M_0$)+$a_w$), where b≠b' such that $V_b(a_w)$=1 and $V_b(a_w)$=0. Let $W_0$ be the first occurrence of such a write request since Write($A_w$, d). By Property 2, b' is unique such that $V_b(a_w)$=0.

Since all assignments to $V_β$(a) for all legal bank-offset pairs (β, a) in the control methodology are for write address offsets, and $W_0$ is the first write request to generate the write offset $a_w$, $V_{b_w}(a_w)$ must never have be written (indeed, the validity table entry $V_b(a_w)$ for any legal value of b) and therefore must still be 0. Likewise, C($a_w$) must still hold the value d. As a result, b'=$b_w$ according to the conditions of the action $V_b(a_w)$=0 for some b'≠b, if and only if $M_b(a_w)$←C($a_w$) and $V_b(a_w)$←1 in Cases 6b and 6d (without memory bypass support). Accordingly, the data transfer from C to M along path $p_4$ must be from C($a_w$) to $M_{b_w}(a_w)$ with $V_{b_w}(a_w)$ assigned the value 1 according to the control methodology.

There may be other intervening write requests after $W_0$ of the form Write(bD($M_0$)+$a_w$), b≠$b_w$, but such subsequent write requests will not alter $M_{b_w}(a_w)$ according to Property 3 above. $V_{b_w}(a_w)$ maintains the value 1 because only a write to R($A_w$) could change $V_{b_w}(a_w)$ back to 0 (e.g., action $V_b$(a)←0 in Cases 6b and 6d), which is assumed not to occur before the read request Read($A_w$). When Read($A_w$) occurs, since $V_{b_w}(a_w)$=1 and $M_{b_w}(a_w)$=d, this read request returns the value d.

Property 9: Read latency is constant.

Proof: From all assignments to q in the illustrative control methodology, Property 7, and the proof of Property 8, the read request Read(A, a) returns the correct value in the next clock cycle from one of the following sources: the cache C, one of the memory banks $M_b$, or the input data itself (where memory bypass is supported), regardless of whether memory bypass is required.

Figure 10:
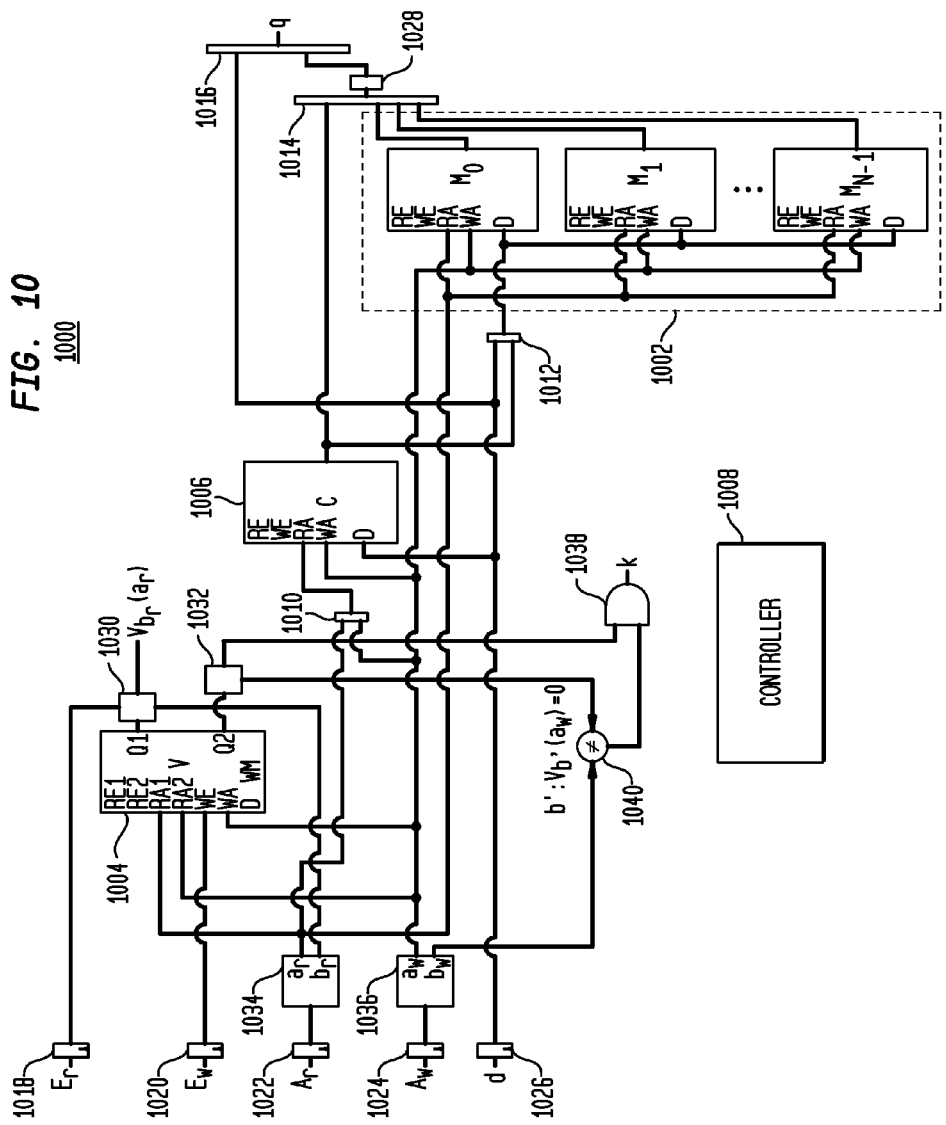
FIG. 10 is a schematic diagram depicting at least a portion of an exemplary baseline multi-port memory comprising a plurality of single-port memory modules, according to an embodiment of the present invention.

FIG. 10 is a schematic diagram depicting at least a portion of an exemplary baseline multi-port memory 1000, according to an embodiment of the invention. Multi-port memory 1000 comprises at least a first memory array 1002 including a plurality (N) of single-port (1RW) memory modules (i.e., memory banks), $M_0, M_1, \ldots, M_{N-1}$, where N is an integer greater than or equal to two. It is to be appreciated that the invention is not limited to any particular number of memory banks in memory array 1002. Although not explicitly shown, each of at least a subset of the memory banks in memory array 1002 comprises a plurality of single-port memory cells which may be implemented, for example, as a single-port RAM or eDRAM module.

Each of at least a subset of the single-port memory banks $M_0, M_1, \ldots, M_{N-1}$ preferably includes a read enable (RE) input adapted to receive a read enable signal, a write enable (WE) input adapted to receive a write enable signal, a read address (RA) input adapted to receive at least a portion of a read address, a write address (WA) input adapted to receive at least a portion of a write address, a data input (D) adapted to receive an input data signal, d, and an output for generating an output data word, q, of the memory bank. The number of bits (i.e., the width) of the read and write addresses supplied to a given memory bank (e.g., $M_0$) is not limited by the invention, but rather will generally be dependent upon a depth (i.e., number of word storage locations) of the memory bank. The read and write enable signals, generated, for example, by selection circuitry included in a controller 1008 of memory 1000, may be utilized to select a given one of the memory banks for performing a read and/or write operation. Connections between the controller 1008 and the respective read and write enable inputs in memory 1000, although not explicitly shown to enhance the readability of the drawings, are implied.

Memory 1000 further includes a second memory array 1004, which may be operative as a validity table (V), coupled with the first memory array 1002. Details of an illustrative validity table suitable for use in memory 1000 were previously described. The validity table 1004 preferably includes a prescribed amount of storage space allocated for each of the individual memory banks $M_0$ through $M_{N-1}$, with the number of storage locations associated with each of the respective memory banks being at least equal to a depth of a corresponding memory bank. As previously explained with reference to FIG. 6, validity table 1004 may, alternatively, be implemented as a plurality of separate, distinct validity tables, each validity table corresponding to a given one of the memory banks. If the validity tables are implemented as distinct memory modules corresponding to the respective memory banks, then each of the validity tables preferably comprises a single-port read, single-port write memory (e.g., 1R1W SRAM).

Conversely, if the validity tables 1004 are implemented collectively as a single memory array, as shown in FIG. 10, then the memory array (1004) preferably comprises a dual-port read, single-port write memory (e.g., 2R1W SRAM), since there may be up to two read addresses, RA1 and RA2, and one write address, WA, during the same clock cycle. Validity table 1004 preferably comprises a write mask (WM), which is operative to mask off a prescribed subset of bits of the word location to be written so as not to update the masked off bits with new data. In accordance with another embodiment, the validity table may employ an encoded value to indicate which memory banks contain invalid data, plus a code indicating that all memory banks contain valid data. In this scenario, $\log_2(N+1)$ bits would be used to represent N memory banks plus the case where all memory banks contain valid data.

Multi-port memory 1000 comprises a cache (C) 1006 operatively coupled with memory array 1002 and validity table 1004. Details of an illustrative cache suitable for use in memory 1000 were described herein above. The cache 1006 is preferably shared by all single-port memory banks in the memory array 1002 on a per memory array address a basis, thereby essentially eliminating the need for complex selection circuitry in memory 1000. It is to be understood, however, that the invention is not limited to a single cache architecture, but rather more than one cache may be employed, as will become apparent to those skilled in the art given the teachings herein. Since there may be a read access and a write access during the same clock cycle, cache 1006 preferably comprises a single-port read, single-port write memory (e.g., 1R1W SRAM).

Cache 1006, like memory banks $M_0$ through $M_{N-1}$, is preferably organized as an array having a depth, D, defining the number of words in the cache, and having a width, W, defining the number of bits in a word in the cache. The depth of the cache 1006 is preferably at least equal to a depth of a given one of the first N−1 memory banks (e.g., $D(C)=D(M_0)$). As previously explained, cache 1006 is preferably operative as a storage mechanism for at least temporarily storing contents of one or more memory banks and/or data to be written into the memory banks. An exemplary mapping between a multi-port address space, R, and a cache was previously described in conjunction with FIG. 8.

Controller 1008 is preferably operative to control one or more operations of the cache 1006 and/or the validity table 1004. Additionally, controller 1008 may control other functions of memory 1000. For example, controller 1008 may be operative to track a status of the memory banks in memory array 1002, to provide memory bypass support, the details of which were described in connection with FIG. 4, and/or to control how data is stored in the multi-port memory 1000. Controller 1008 is preferably further operative to implement a cache management methodology for evaluating the status of data stored in the memory banks and cache and for determining where data is stored as a function of the status information.

Multi-port memory 1000 may include one or more multiplexers, 1010, 1012, 1014 and 1016, operative to select one of a plurality of data paths in the memory as a function of respective control signals (not explicitly shown) supplied to the multiplexers. For example, multiplexer 1010 is preferably operative to select at least a portion of either a read address, Ar, (e.g., $a_r$) or a write address, Aw, (e.g., $a_w$) supplied to memory 1000 as a read address signal provided to a read address (RA) input of cache 1006. Similarly, multiplexer 1012 is preferably operative to select, as the data signal provided to the memory banks, either a data word from the cache 1006 or an input data word d supplied to the memory 1000 (e.g., as part of a write request).

One or more flip-flops 1018, 1020, 1022, 1024, 1026 and 1028, or alternative storage elements, may be included in multi-port memory 1000 for at least temporarily storing (e.g., latching) a logic state of an input signal supplied to the memory 1000 and/or an output signal generated by the memory 1000. As previously stated regarding the use of flip-flops, whether they are implemented in the physical memory (e.g., memory banks $M_0$ through $M_{N-1}$ in memory array 1002, validity table 1004, and/or cache 1006) or externally as part of memory 1000, signals supplied to memory 1000 may need to go to both flops as well as the physical memory, and may even go through controller 1008 before being latched by the physical memory (assuming the physical memory includes such latching capability). This is similar to retiming (i.e., the location of the flip-flops can be move before or after logic for timing closure purposes without affecting logic correctness). Retiming may even change number of flip-flops required by memory 1000 (e.g., if there were two flip-flops before an AND gate, moving the flip-flop after the AND gate will reduce the number of flip-flops from two to one).

Flip-flop 1018 is preferably operative to latch a logic state of a read enable signal, $E_r$, supplied to memory 1000, flip-flop 1020 is operative to latch a logic state of a write enable signal, $E_w$, supplied to the memory 1000, flip-flop 1022 is operative to latch a logic state of a read address, $A_r$, supplied to the memory 1000, flip-flop 1024 is operative to latch a logic state of a write address, $A_w$, supplied to the memory 1000, and flip-flop 1026 is operative to latch a logic state of the input data signal d. Data read from either the single-port memory array 1002 or the cache 1006 to be output by memory 1000 (via multiplexer 1016) may be latched by flip-flop 1028.

As previously stated, $a_w$ preferably represents a write address of physical memory 1000 and is defined as Offset($A_w$, $D(M_0)$), $a_r$ represents a read address the physical memory 1000 and is defined as Offset($A_r$, $D(M_0)$), $b_w$ represents a memory bank to be written and is defined as Bank($A_w$, $D(M_0)$), and $b_r$ represents a memory bank to be read and is defined as Bank($A_r$, $D(M_0)$), where Offset(x, y) and Bank(x, y) are logical-to-physical address mapping functions, $A_w$ is the write address of the logical multi-port memory, which is valid only when the write enable $E_w$ to the physical memory is asserted (e.g., logic "1"), and $A_r$ is the read address of the logical multi-port memory, which is valid only when the read enable $E_r$ to the physical memory is asserted. As a result, $A_w=b_wD(M_0)+a_w$, and $A_r=b_rD(M_0)+a_r$.

In terms of operation, multi-port memory 1000 includes critical paths involving a memory read followed by a memory write during cache eviction. With standard cache implementations, cache eviction replaces the data in the cache line with new data. Unlike in a CPU caching environment, data stored in the cache cannot be simply overwritten without being stored in its proper physical memory location. Thus, in order to prevent valid data held in the cache from being lost, the original data in the cache 1006 must be transferred to the appropriate memory bank, as previously described.

When a collision occurs (i.e., when $b_w=b_r$, $E_r=1$, and $E_w=1$) and the read memory bank $M_{b_r}$ contains valid data (i.e., $V_{b_r}(a_r)=1$), the write data (d) must be stored in the cache ($C(a_w)$). However, if the cache entry corresponding to the write address is already holding data for some other memory bank b', b'≠$b_w$ (i.e., $V_{b_w}(a_w)=0$), then that cache entry must be evicted. Specifically, the original data held in the cache entry is preferably transferred to the corresponding memory bank location $M_{b'}(a_w)$ or else the data therein will be overwritten. The write enable signal WE of the memory bank $M_{b'}(a_w)$ is asserted only after the data in cache 1006 $C(a_w)$ is evicted from the cache and after some computational delay (i.e., two concurrent validity table look-ups at the read and write offsets, $V_{b_r}(a_r)$ and $V(a_w)$, respectively, where $V(a_w)$ represents the validity table entries corresponding to all memory banks at address offset $a_w$, and a search for the bank number b' such that $V_{b'}(a_w)=0$ and b'≠$b_w$).

To accomplish this, memory 1000 preferably includes logic circuitry operative to determine whether the original data being held in the cache at a specified address is valid. More particularly, the read enable signal $E_r$, which is latched by flip-flop 1018, is supplied to an enable input of a demultiplexer (demux) element 1030 operative to provide, at a first output, Q1, of validity table 1004, a signal indicative of a value of the validity table entry corresponding to a selected memory bank to be read ($b_r$) at a given read address offset $a_r$ (e.g., $V_{b_r}(a_r)$). This signal may be used by controller 1008, although a connection to the controller is omitted here for clarity purposes. A demultiplexer and search block 1032, connected with a second output, Q2, of validity table 1004, is preferably operative to provide two signals: (i) signal $V_{b_w}(a_w)$, which is indicative of the validity table entry corresponding to write memory bank $b_w$ at write address offset $a_w$, which is supplied to a logical AND gate 1038; and (ii) signal b', which is a result of a search of validity table entries for all memory banks at write address offset $a_w$, namely, V ($a_w$), for finding a memory bank b' that satisfies the condition $V_{b'}(a_w)=0$. Here, b' is the memory bank identifier (ID) of the data currently residing in the cache 1006 at $C(a_w)$, which may need to be evicted.

Read address offset $a_r$ and read memory bank identifier $b_r$ are preferably generated from the read address $A_r$ of the logical multi-port memory (e.g., as may be associated with a read request) using a logical address to physical address mapping block 1034, which is operative to map a logic address x to bank address b and offset a, connected with an output of flip-flop 1022. Likewise, write address offset $a_w$ and write memory bank identifier $b_w$ are preferably generated from the write address $A_w$ of the logical multi-port memory (e.g., as may be associated with a write request) using address mapping block 1036, which may be identical to block 1034, connected with an output of flip-flop 1024. The address mapping blocks 1034 and 1036 maybe operative to assign prescribed portions of read address $A_r$ and write address $A_w$, respectively, to generate the corresponding address offset (a) and memory bank identifiers (b).

A logical AND gate 1038 is operative to receive, at a first input thereof, the signal $V_{b_w}(a_w)$ generated by block 1032. A comparator 1040 included in memory 1000 is preferably operative to compare a value b' generated by block 1032, which is the bank ID corresponding to data that may need to be evicted from the cache 1006 at address offset $a_w$, with the memory bank identifier $b_w$ generated by block 1036 and to generate a signal indicative of whether $b_w$ is equal to b', which constitutes part of the condition for cache data at offset $a_w$ to be evicted. The comparison result is supplied to a second input of AND gate 1038. An output signal, k, generated by AND gate 1038 is preferably indicative of whether that cache entry is already holding data for some other memory bank b' (i.e., $V_{b'}(a_w)=0$ and b'≠$b_w$) and needs to be evicted. It is to be understood that, although shown as being separate and distinct functional blocks, at least a portion of one or more of the blocks in memory 1000, including, for example, multiplexers 1010, 1012, 1014 and 1016, demultiplexers 1030 and 1032, AND gate 1038, and/or comparator 1040, may be incorporated into the controller 1008.

By way of example only and without loss of generality, an illustrative operation of multi-port memory 1000 is shown herein below in conjunction with Tables 1 through 5 for different logic states of the various input signals. Specifically, with reference to FIG. 10, Table 1 shows various read-write combinations and corresponding logic states of the read enable signal $E_r$, write enable signal $E_w$, and validity table values for a given bank-offset pair, $V(b_r, a_r)$, when the read and write memory banks are the same (i.e., when $b_r=b_w$ is true), when the read and write memory banks are different (i.e., when $b_r==b_w==$ is false), when the read and write offsets are the same (i.e., when $a_r==a_w$ is true), and when the read and write offsets are different (i.e., when $a_r==a_w$ is false). Table 2 shows the selected data paths for the multiplexers 1010, 1012, 1014 and 1016 for the various read-write combinations listed in Table 1. Table 3 shows the logic states of the cache 1006 input signals WE, WA, D, RE and RA for the various read-write combinations listed in Table 1. Table 4 shows the logic states of the validity table 1004 for the various read-write combinations listed in Table 1. Table 5 shows the logic states of the memory bank input signals WE, WA, D, RE and RA for the various read-write combinations listed in Table 1. In the tables below, "X" represents a "don't care" condition and "d1" represents a latched version of the input data d.

TABLE 1

| Case | Description | $E_r$ | $E_w$ | $V(b_r, a_r)$ | $b_r = b_w$ | $a_r = a_w$ |
|---|---|---|---|---|---|---|
| 0 | Idle | False | False | False | False | False |
| 1 | Idle | False | False | False | False | True |
| 2 | Idle | False | False | False | True | False |
| 3 | Idle | False | False | False | True | True |
| 4 | Idle | False | False | True | False | False |
| 5 | Idle | False | False | True | False | True |
| 6 | Idle | False | False | True | True | False |
| 7 | Idle | False | False | True | True | True |
| 8 | Write Only | False | True | False | False | False |
| 9 | Write Only | False | True | False | False | True |
| 10 | Write Only | False | True | False | True | False |
| 11 | Write Only | False | True | False | True | True |
| 12 | Write Only | False | True | True | False | False |
| 13 | Write Only | False | True | True | False | True |
| 14 | Write Only | False | True | True | True | False |
| 15 | Write Only | False | True | True | True | True |
| 16 | Read Only, Memory Invalid | True | False | False | False | False |
| 17 | Read Only, Memory Invalid | True | False | False | False | True |
| 18 | Read Only, Memory Invalid | True | False | False | True | False |
| 19 | Read Only, Memory Invalid | True | False | False | True | True |
| 20 | Read Only, Memory Valid | True | False | True | False | False |
| 21 | Read Only, Memory Valid | True | False | True | False | True |
| 22 | Read Only, Memory Valid | True | False | True | True | False |
| 23 | Read Only, Memory Valid | True | False | True | True | True |
| 24 | Read and Write Different Banks, Different Offsets, Read Memory Invalid | True | True | False | False | False |
| 25 | Read and Write Different Banks, Same Offset, Read Memory Invalid | True | True | False | False | True |
| 26 | Read and Write Same Banks, Different Offsets, Memory Invalid | True | True | False | True | False |
| 27 | Read and Write Same Banks, Same Offset, Memory Invalid | True | True | False | True | True |
| 28 | Read and Write Different Banks, Different Offsets, Read Memory Valid | True | True | True | False | False |
| 29 | Read and Write Different Banks, Same Offset, Read Memory Valid | True | True | True | False | True |
| 30 | Read and Write Same Banks, Different Offsets, Memory Valid | True | True | True | True | False |
| 31 | Read and Write Same Banks, Same Offset, Memory Valid | True | True | True | True | True |

TABLE 2

| | | MUX Selects | | | |
|---|---|---|---|---|---|
| Case | Description | 1016 | 1014 | 1010 | 1012 |
| 0 | Idle | X | X | X | X |
| 1 | Idle | X | X | X | X |
| 2 | Idle | X | X | X | X |
| 3 | Idle | X | X | X | X |
| 4 | Idle | X | X | X | X |
| 5 | Idle | X | X | X | X |
| 6 | Idle | X | X | X | X |
| 7 | Idle | X | X | X | X |
| 8 | Write Only | X | X | X | d1 |
| 9 | Write Only | X | X | X | d1 |
| 10 | Write Only | X | X | X | d1 |
| 11 | Write Only | X | X | X | d1 |
| 12 | Write Only | X | X | X | d1 |
| 13 | Write Only | X | X | X | d1 |
| 14 | Write Only | X | X | X | d1 |
| 15 | Write Only | X | X | X | d1 |
| 16 | Read Only, Memory Invalid | M | C | $a_r$ | X |
| 17 | Read Only, Memory Invalid | M | C | $a_r$ | X |
| 18 | Read Only, Memory Invalid | M | C | $a_r$ | X |
| 19 | Read Only, Memory Invalid | M | C | $a_r$ | X |
| 20 | Read Only, Memory Valid | M | $M\_b_r$ | X | X |
| 21 | Read Only, Memory Valid | M | $M\_b_r$ | X | X |
| 22 | Read Only, Memory Valid | M | $M\_b_r$ | X | X |
| 23 | Read Only, Memory Valid | M | $M\_b_r$ | X | X |
| 24 | Read and Write Different Banks, Different Offsets, Read Memory Invalid | M | C | $a_r$ | d1 |
| 25 | Read and Write Different Banks, Same Offset, Read Memory Invalid | M | C | $a_r$ | d1 |
| 26 | Read and Write Same Bank, Different Offsets, Memory Invalid | M | C | $a_r$ | d1 |
| 27 | Read and Write Same Bank, Same Offset, Memory Invalid | Memory Bypass ? D:M | Memory Bypass ? X:C | $a_r$ | d1 |
| 28 | Read and Write Different Banks, Different Offsets, Read Memory Valid | M | $M\_b_r$ | X | d1 |
| 29 | Read and Write Different Banks, Same Offset, Read Memory Valid | M | $M\_b_r$ | X | d1 |
| 30 | Read and Write Same Bank, Different Offsets, Memory Valid | M | $M\_b_r$ | $a_w$ | C |
| 31 | Read and Write Same Bank, Same Offset, Memory Valid | Memory Bypass ? D:M | Memory Bypass ? $X:M\_b_r$ | $a_w$ | C |

TABLE 3

| Case | Description | Cache Inputs | | | | |
|---|---|---|---|---|---|---|
| | | WE | WA | D | RE | RA |
| 0 | Idle | 0 | X | X | 0 | X |
| 1 | Idle | 0 | X | X | 0 | X |
| 2 | Idle | 0 | X | X | 0 | X |
| 3 | Idle | 0 | X | X | 0 | X |
| 4 | Idle | 0 | X | X | 0 | X |
| 5 | Idle | 0 | X | X | 0 | X |
| 6 | Idle | 0 | X | X | 0 | X |
| 7 | Idle | 0 | X | X | 0 | X |
| 8 | Write Only | 0 | X | X | 0 | X |
| 9 | Write Only | 0 | X | X | 0 | X |
| 10 | Write Only | 0 | X | X | 0 | X |
| 11 | Write Only | 0 | X | X | 0 | X |
| 12 | Write Only | 0 | X | X | 0 | X |
| 13 | Write Only | 0 | X | X | 0 | X |
| 14 | Write Only | 0 | X | X | 0 | X |
| 15 | Write Only | 0 | X | X | 0 | X |
| 16 | Read Only, Memory Invalid | 0 | X | X | 1 | $a_r$ |
| 17 | Read Only, Memory Invalid | 0 | X | X | 1 | $a_r$ |
| 18 | Read Only, Memory Invalid | 0 | X | X | 1 | $a_r$ |
| 19 | Read Only, Memory Invalid | 0 | X | X | 1 | $a_r$ |
| 20 | Read Only, Memory Valid | 0 | X | X | X | X |
| 21 | Read Only, Memory Valid | 0 | X | X | X | X |
| 22 | Read Only, Memory Valid | 0 | X | X | X | X |
| 23 | Read Only, Memory Valid | 0 | X | X | X | X |
| 24 | Read and Write Different Banks, Different Offsets, Read Memory Invalid | 0 | X | X | 1 | $a_r$ |
| 25 | Read and Write Different Banks, Same Offset, Read Memory Invalid | 0 | X | X | 1 | $a_r$ |
| 26 | Read and Write Same Banks, Different Offsets, Memory Invalid | 0 | X | X | 1 | $a_r$ |
| 27 | Read and Write Same Bank, Same Offset, Memory Invalid | 0 | X | X | 1 | $a_r$ |
| 28 | Read and Write Different Banks, Different Offsets, Read Memory Valid | 0 | X | X | 0 | X |
| 29 | Read and Write Different Banks, Same Offset, Read Memory Valid | 0 | X | X | 0 | X |
| 30 | Read and Write Same Bank, Different Offsets, Memory Valid | 1 | $a_w$ | d1 | 1 | $a_w$ |
| 31 | Read and Write Same Bank, Same Offset, Memory Valid | !Memory Bypass | X | d1 | 1 | $a_w$ |

TABLE 4

| Case | Description | Validity Table Inputs | | | | | | | |
|---|---|---|---|---|---|---|---|---|---|
| | | RE1 | RA1 | RE2 | RA2 | WE* | WA* | WM* | D* |
| 0 | Idle | X | X | X | X | 0 | X | X | X |
| 1 | Idle | X | X | X | X | 0 | X | X | X |
| 2 | Idle | X | X | X | X | 0 | X | X | X |
| 3 | Idle | X | X | X | X | 0 | X | X | X |
| 4 | Idle | X | X | X | X | 0 | X | X | X |
| 5 | Idle | X | X | X | X | 0 | X | X | X |
| 6 | Idle | X | X | X | X | 0 | X | X | X |
| 7 | Idle | X | X | X | X | 0 | X | X | X |
| 8 | Write Only | X | X | X | X | 1 | $a_w$ | $b_w$ | 1 |
| 9 | Write Only | X | X | X | X | 1 | $a_w$ | $b_w$ | 1 |
| 10 | Write Only | X | X | X | X | 1 | $a_w$ | $b_w$ | 1 |
| 11 | Write Only | X | X | X | X | 1 | $a_w$ | $b_w$ | 1 |
| 12 | Write Only | X | X | X | X | 1 | $a_w$ | $b_w$ | 1 |
| 13 | Write Only | X | X | X | X | 1 | $a_w$ | $b_w$ | 1 |
| 14 | Write Only | X | X | X | X | 1 | $a_w$ | $b_w$ | 1 |
| 15 | Write Only | X | X | X | X | 1 | $a_w$ | $b_w$ | 1 |
| 16 | Read Only, Memory Invalid | 1 | $a_r$ | X | X | 0 | X | X | X |
| 17 | Read Only, Memory Invalid | 1 | $a_r$ | X | X | 0 | X | X | X |
| 18 | Read Only, Memory Invalid | 1 | $a_r$ | X | X | 0 | X | X | X |
| 19 | Read Only, Memory Invalid | 1 | $a_r$ | X | X | 0 | X | X | X |
| 20 | Read Only, Memory Valid | 1 | $a_r$ | X | X | 0 | X | X | X |
| 21 | Read Only, Memory Valid | 1 | $a_r$ | X | X | 0 | X | X | X |
| 22 | Read Only, Memory Valid | 1 | $a_r$ | X | X | 0 | X | X | X |
| 23 | Read Only, Memory Valid | 1 | $a_r$ | X | X | 0 | X | X | X |
| 24 | Read and Write Different Banks, Different Offsets, Read Memory Invalid | 1 | $a_r$ | X | X | 1 | $a_w$ | $b_w$ | 1 |
| 25 | Read and Write Different Banks, Same Offset, Read Memory Invalid | 1 | $a_r$ | X | X | 1 | $a_w$ | $b_w$ | 1 |
| 26 | Read and Write Same Bank, Different Offsets, Memory Invalid | 1 | $a_r$ | X | X | 1 | $a_w$ | $b_w$ | 1 |
| 27 | Read and Write Same Bank, Same Offset, Memory Invalid | 1 | $a_r$ | X | X | 1 | $a_w$ | $b_w$ | 1 |
| 28 | Read and Write Different Banks, Different Offsets, Read Memory Valid | 1 | $a_r$ | X | X | 1 | $a_w$ | $b_w$ | 1 |
| 29 | Read and Write Different Banks, Same Offset, Read Memory Valid | 1 | $a_r$ | X | X | 1 | $a_w$ | $b_w$ | 1 |
| 30 | Read and Write Same Bank, Different Offsets, Memory Valid | 1 | $a_r$ | 1 | $a_w$ | 1 | $a_w$ | ($b_w$, b') | (0, 1) |
| 31 | Read and Write Same Bank, Same Offset, Memory Valid | 1 | $a_r$ | 1 | $a_w$ | 1 | $a_w$ | ($b_w$, b') | (0, 1) |

*Steady state only. Does not include initialization.

TABLE 5

| Case | Description | Memory Bank $M_b$ | | | | |
|---|---|---|---|---|---|---|
| | | WE | WA | D | RE | RA |
| 0 | Idle | 0 | X | X | 0 | X |
| 1 | Idle | 0 | X | X | 0 | X |
| 2 | Idle | 0 | X | X | 0 | X |
| 3 | Idle | 0 | X | X | 0 | X |
| 4 | Idle | 0 | X | X | 0 | X |
| 5 | Idle | 0 | X | X | 0 | X |
| 6 | Idle | 0 | X | X | 0 | X |
| 7 | Idle | 0 | X | X | 0 | X |
| 8 | Write Only | $b = b_w$ | $a_w$ | d1 | 0 | X |
| 9 | Write Only | $b = b_w$ | $a_w$ | d1 | 0 | X |
| 10 | Write Only | $b = b_w$ | $a_w$ | d1 | 0 | X |
| 11 | Write Only | $b = b_w$ | $a_w$ | d1 | 0 | X |
| 12 | Write Only | $b = b_w$ | $a_w$ | d1 | 0 | X |
| 13 | Write Only | $b = b_w$ | $a_w$ | d1 | 0 | X |
| 14 | Write Only | $b = b_w$ | $a_w$ | d1 | 0 | X |
| 15 | Write Only | $b = b_w$ | $a_w$ | d1 | 0 | X |
| 16 | Read Only, Memory Invalid | 0 | X | X | 0 | X |
| 17 | Read Only, Memory Invalid | 0 | X | X | 0 | X |
| 18 | Read Only, Memory Invalid | 0 | X | X | 0 | X |
| 19 | Read Only, Memory Invalid | 0 | X | X | 0 | X |
| 20 | Read Only, Memory Valid | 0 | X | X | $b = b_r$ | $a_r$ |
| 21 | Read Only, Memory Valid | 0 | X | X | $b = b_r$ | $a_r$ |
| 22 | Read Only, Memory Valid | 0 | X | X | $b = b_r$ | $a_r$ |
| 23 | Read Only, Memory Valid | 0 | X | X | $b = b_r$ | $a_r$ |
| 24 | Read and Write Different Banks, Different Offsets, Read Memory Invalid | $b = b_w$ | $a_w$ | d1 | 0 | X |
| 25 | Read and Write Different Banks, Same Offset, Read Memory Invalid | $b = b_w$ | $a_w$ | d1 | 0 | X |
| 26 | Read and Write Same Bank, Different Offsets, Memory Invalid | $b = b_w$ | $a_w$ | d1 | 0 | X |
| 27 | Read and Write Same Bank, Same Offset, Memory Invalid | $b = b_w$ | $a_w$ | d1 | 0 | X |
| 28 | Read and Write Different Banks, Different Offsets, Read Memory Valid | $b = b_w$ | $a_w$ | d1 | $b = b_r$ | $a_r$ |
| 29 | Read and Write Different Banks, Same Offset, Read Memory Valid | $b = b_w$ | $a_w$ | d1 | $b = b_r$ | $a_r$ |
| 30 | Read and Write Same Bank, Different Offsets, Memory Valid | k? $b = b':0$ | $a_w$ | C | $b = b_r$ | $a_r$ |
| 31 | Read and Write Same Bank, Same Offset, Memory Valid | If memory bypass $b = b_w$, else k ? $b = b'$, $b = b_w$ | $a_w$ | C | $b = b_r$ | $a_r$ |

As previously stated, when data is to be written into the cache, the original data stored therein (assuming it is valid data) is preferably transferred to the appropriate memory bank to accommodate the incoming new data. As a result, a bottleneck exists between the cache output and the memory bank input. In order to avoid this bottleneck, the multi-port memory 1000 can be modified to include a pipeline circuit, as will be described in further detail below with reference to FIG. 11. The pipeline circuit is preferably inserted between the cache read and the memory bank write to thereby remove the cache eviction critical paths. It will be shown that this pipeline circuit beneficially maintains the read latency.

Figure 11:
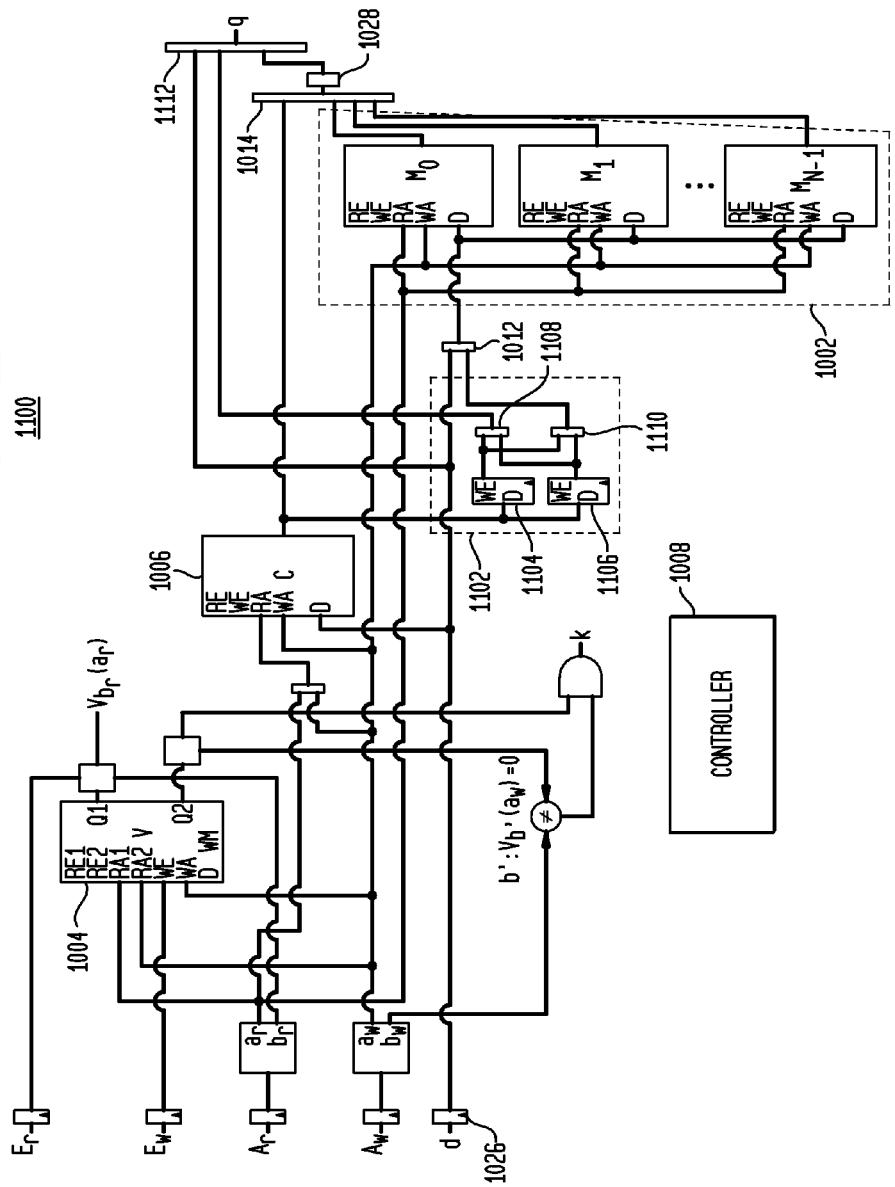
FIG. 11 is a schematic diagram depicting at least a portion of an exemplary multi-port memory comprising a plurality of single-port memory modules, with internal data path pipelined, according to an embodiment of the present invention.

FIG. 11 is a schematic diagram depicting at least a portion of an exemplary pipelined multi-port memory 1100 comprising a plurality of single-port memory modules, according to an embodiment of the invention. Multi-port memory 1100 is essentially the same as memory 1000 shown in FIG. 10, except that memory 1100 includes a pipelined architecture for maintaining read latency and enhancing overall performance. More particularly, maximum operating frequency of multi-port memory 1100 is preferably increased by including a pipeline circuit 1102 connected between the output of cache 1006 and the inputs to the single-port (1RW) memory banks $M_0$ through $M_{N-1}$ in memory array 1002. By introducing additional bypass paths from the pipeline circuit 1102 to the output of memory 1100, one or more extra cycles are provided for the data from the cache 1006 to be written into a corresponding memory bank in memory array 1002, while keeping the read latency in the memory 1000 the same.

Pipeline circuit 1102, in this embodiment, comprises two parallel buffers. Specifically, pipeline circuit 1102 includes first and second flip-flops, 1104 and 1106, respectively, or an alternative buffer element. Rather than connecting the output of cache 1006 directly to multiplexer 1012 (which, in turn, is connected with the data input (D) of the memory banks in memory array 1002), as in the memory 1000 shown in FIG. 10, the output of the cache is connected with an input of the flip-flops 1104 and 1106 in pipeline circuit 1102. Pipeline circuit 1102 further includes a pair of two-input multiplexers, 1108 and 1110. An output of flip-flop 1104 is connected with respective first inputs of multiplexers 1108 and 1110, and an output of flip-flop 1106 is connected with respective second inputs of the multiplexers 1108 and 1110. An output of multiplexer 1108 is connected with an input of output multiplexer 1112 which is operative to generate the output signal q of the memory 1100. Multiplexer 1112 is essentially the same as multiplexer 1016 in FIG. 10, except that it provides at least one additional input for the bypass path associated with pipeline circuit 1102. An output of multiplexer 1110 is connected with an input of multiplexer 1012 which is operative to select the input data source to the memory banks.

Control signals for selecting a given multiplexer input for multiplexers 1108 and 1110 are generated by controller 1008, which is preferably modified to take into account the added pipeline circuit 1102. Preferably, the memory bank identifier (b) and address offset (a) associated with the pipeline data are also stored. The pipeline circuit also carries a valid bit. Thus, each of the pipeline buffers (e.g., 1104 and 1106) preferably has four components associated therewith which may be used for determining a status of the buffer; namely, an address offset, a memory bank identification number of a destination memory bank, data evicted from the cache memory, and a valid bit to indicate whether or not the buffer stage is available for storing new data. Read and write operations will not only check the validity table but will also check the two addresses and two valid signals stored in the pipeline circuit to determine where the data is located. The pipeline circuit 1102 therefore functions essentially as an extended cache which operates in a manner similar to cache 1006 and can be considered as part of the cache.

It cannot be guaranteed that data transferred out of cache memory can be written back to its destination memory bank in the next few clock cycles, since the destination memory bank may be busy. Thus, if only one pipeline stage is used, there is a likelihood that data may overflow with new data coming from cache memory during the next cycle. When memory array 1002 does not contain latches at the input, two pipeline buffers are sufficient, as shown in FIG. 11. However, when memory 1002 contains input latches, as most synchronized memories do, it can be shown that four pipeline buffers are sufficient for avoiding any cache data overflow.

Figure 12:
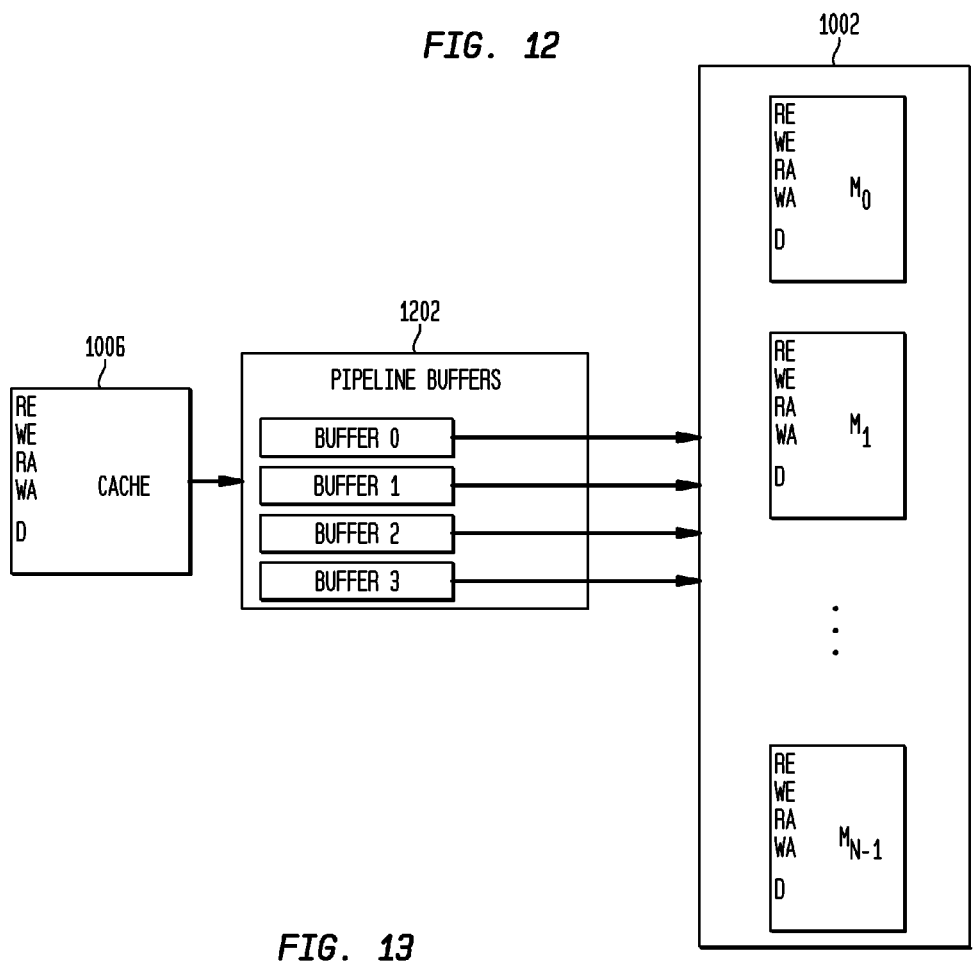
FIG. 12 is a block diagram depicting at least a portion of an exemplary pipeline circuit suitable for use in the illustrative multi-port memory shown in FIG. 11, according to an embodiment of the invention.

FIG. 12 is a block diagram depicting at least a portion of an exemplary pipeline circuit 1202 suitable for use in the illustrative multi-port memory 1100 shown in FIG. 11, according to an embodiment of the invention. Like the pipeline circuit 1102 shown in FIG. 11, pipeline circuit 1202 is preferably connected between an output of the cache 1006 and the input of the respective single-port memory banks $M_0$ through $M_{N-1}$ in the memory array 1002. In this embodiment, pipeline circuit 1202 includes four buffers, buffer 0, buffer 1, buffer 2 and buffer 3, connected in a parallel configuration. At least a subset of the buffers may be implemented using one or more flip-flops, in a manner consistent with pipeline circuit 1102 (see FIG. 11).

As previously stated, each of the pipeline buffers (e.g., buffer 0 through 3) preferably has four components associated therewith which may be used for determining a status of the buffer; namely, an address offset, a memory bank identification number of a destination memory bank, data evicted from the cache memory, and a valid bit to indicate whether or not the buffer stage is available for storing new data. Evicted data from the cache 1006 is preferably pushed into one of the available pipeline buffers in pipeline circuit 1202 in accordance with a control methodology, which may be implemented, for example, by controller 1008 in FIG. 11. The pipeline buffer writes its data to respective bank memories when it is not busy, and leaves itself available to store the next data evicted from the cache 1006. Although pipeline circuit 1202 is depicted as comprising four buffers, it is to be understood that the present invention is not limited to any particular number of buffers.

The buffer arrangement of pipeline circuit 1202 has a benefit of reducing the complexity of buffer prioritization, since the data from the cache 1006 is supplied to all buffers concurrently. One trade-off in using this approach, however, is that the buffers are required to have a more stringent speed requirement, since data coming out of the cache 1006 is distributed to all buffers and hence slows down. This approach may also consume more power compared to other pipeline configurations. Therefore, at least from a timing and/or power perspective, the four buffers, buffers 0 through 3, in pipeline circuit 1202 can be arranged in various alternative configurations between the cache 1006 and the memory banks in memory array 1002 to achieve a similar function, and can be prioritized differently when receiving evicted data from the cache, depending upon the application in which the multi-port memory is employed.

Figure 13:
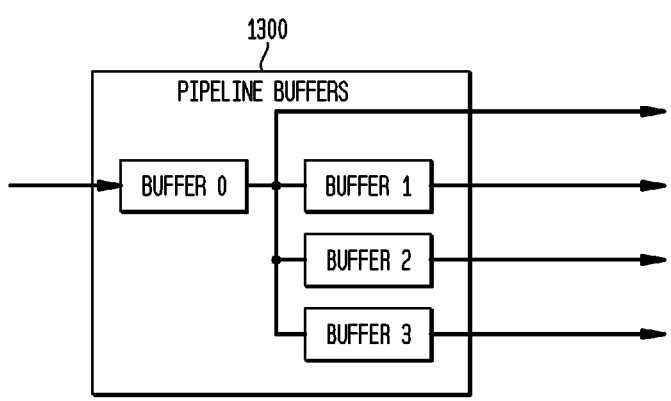
FIG. 13 is a block diagram depicting at least a portion of an exemplary pipeline circuit suitable for use in the illustrative multi-port memory shown in FIG. 11, according to another embodiment of the invention.

By way of illustration only and without limitation, FIG. 13 is a block diagram depicting at least a portion of an exemplary pipeline circuit 1300 suitable for use in the illustrative multi-port memory 1100 shown in FIG. 11, according to another embodiment of the invention. Pipeline circuit 1300, like pipeline circuit 1202 shown in FIG. 12, preferably includes four buffers, buffer 0, buffer 1, buffer 2, and buffer 3, although the buffers in pipeline circuit 1300 are configured in a different manner. Specifically, in this embodiment, rather than each buffer being directly connected with the cache 1006 (see FIG. 12), pipeline circuit 1300 is configured having two stages in series with one another.

More particularly, a first buffer stage comprising buffer 0 is connected with the cache (e.g., cache 1006 in FIG. 12) and is operative to receive data from the cache. A second buffer stage, which preferably comprises the remaining buffers, buffer 1, buffer 2 and buffer 3, is configured such that respective inputs of buffers 1 through 3 are connected with an output of buffer 0. Outputs of each of the buffers in pipeline circuit 1300 are preferably connected with the single-port memory banks in memory array 1002 (see FIG. 12) and form outputs of the pipeline circuit.

When data is evicted from the cache 1006 (FIG. 12), it will first be written into the first buffer stage (buffer 0) in the pipeline circuit 1300. When the valid bit corresponding to Buffer 0 is not set, no further action needs to be taken on buffer 0. Conversely, when the valid bit corresponding to buffer 0 is set (indicating that the data stored therein is valid), the data stored in buffer 0 is preferably transferred into one of the available buffers (e.g., buffers 1 through 3) in the second stage or written to memory array 1002. When data is transferred from the first buffer stage to the second buffer stage in pipeline circuit 1300, the determination as to which of the three remaining to send the data can be prioritized according to a prescribed prioritization scheme.

The following scheme provides an exemplary methodology for prioritizing the buffers in the second buffer stage: Buffer 1→Buffer 2→Buffer 3. In this simple prioritization scheme, assuming the valid bit associated with buffer 1 is not set or the data stored in buffer 1 has a chance to be written back to its destination memory bank, then buffer 1 will store the data from buffer 0. Otherwise, if buffer 1 is not available (i.e., the valid bit in buffer 1 is set), the availability of buffer 2 will be checked. If the valid bit associated with buffer 2 is not set or the data stored in buffer 2 has a chance to be written back to its destination memory bank, then buffer 2 will store the data from buffer 0. Otherwise, if buffer 2 is not available, the data from buffer 0 will be stored in buffer 3. If there are no stage 2 buffers available, it is guaranteed that data in buffer 0 will be stored in memory array 1002 if memory 1000 is a two-port (1R1W) memory. In this manner, the pipeline circuit is operative essentially as an extended cache memory, as previously stated. Data in one or more of the pipeline buffers might be accessed in the same manner as the cache memory for read and/or write activities in the memory.

Regardless of the prioritization scheme used in the pipeline circuit, it can be shown that four buffers are sufficient for avoiding data overflow in the multi-port memory. For this illustrative discussion, the exemplary pipeline circuit 1300 shown in FIG. 13 will be used, in conjunction with Table 6 below, where entry "X" represents a "Don't Care" condition, and entry "A" represents an "Available" condition. In Table 6, from cycle 0 to cycle 4, the cache memory content will first be initialized by generating access collisions on the same memory bank; then, it will be demonstrated how all four buffers in pipeline circuit 1300 are populated, emptied and ready to store new data again.

TABLE 6

| Cycle No. | Read Address | Write Address | Write Cache Output | Buffer 0 | Buffer 1 | Buffer 2 | Buffer 3 |
|---|---|---|---|---|---|---|---|
| 0 | $M_b(a)$ | $M_b(b)$ | X | X | X | X | X |
| 1 | $M_b(c)$ | $M_b(d)$ | X | X | X | X | X |
| 2 | $M_a(b)$ | $M_a(a)$ | X | X | X | X | X |
| 3 | $M_c(a)$ | $M_c(c)$ | X | X | X | X | X |
| 4 | $M_a(a)$ | $M_a(b)$ | X | X | X | X | X |
| 5 | $M_a(a)$ | $M_a(d)$ | $M_b(b)$ | A | A | A | A |
| 6 | $M_b(c)$ | $M_b(a)$ | $M_b(d)$ | $M_b(b)$ | A | A | A |
| 7 | $M_b(a)$ | $M_b(c)$ | $M_a(a)$ | $M_b(d)$ | $M_b(b)$ | A | A |
| 8 | $M_a(a)$ | $M_b(b)$ | $M_c(c)$ | $M_a(a)$ | $M_b(b)$ | $M_b(d)$ | A |
| 9 | $M_a(a)$ | $M_b(d)$ | X | $M_c(c)$ | $M_b(b)$ | $M_b(d)$ | $M_a(a)$ |
| 10 | X | X | X | X | X | X | X |

With reference to Table 6 above, in cycle 0, a read request to $M_b(a)$ and a write request to $M_b(b)$ are issued, where $M_i(j)$ is intended to refer to address offset j in memory bank i. Data destined for $M_b(b)$ is written into cache memory at offset b due to a collision on the same bank.

In cycle 1, a read request to $M_b(c)$ and a write request to $M_b(d)$ are issued. Data destined for $M_b(d)$ is written into cache memory at offset d due to a collision on the same bank.

In cycle 2, a read request to $M_a(b)$ and a write request to $M_a(a)$ are issued. Data destined for $M_a(a)$ is written into cache memory at offset a due to a collision on the same bank.

In cycle 3, a read request to $M_c(a)$ and a write request to Mac) are issued. Data destined for Mac) is written into cache memory at offset c due to a collision on the same bank.

In cycle 4, a read request to $M_a(a)$ and a write request to $M_a(b)$ are issued. Data destined for $M_a(b)$ is written into the cache memory at offset b due to a collision on the same bank. Note, that data for $M_b(b)$ occupies offset b of the cache memory. Therefore, this data is preferably evicted to make room for data for $M_a(b)$.

In cycle 5, data destined for $M_b(b)$ is evicted from the cache.

In cycle 6, data destined for $M_b(b)$ is pushed into buffer 0, since buffer 0 is available. Concurrently, data destined for $M_b(d)$ is evicted from the cache memory.

In cycle 7, data destined for $M_b(b)$ is pushed from buffer 0 into buffer 1, since memory bank $M_b$ is busy and buffer 1 is available. Concurrently, data destined for $M_b(d)$ is pushed into buffer 0, and data destined for $M_a(a)$ is evicted from the cache memory.

In cycle 8, since both memory banks $M_a$ and $M_b$ are busy, data destined for $M_b(d)$ is pushed from buffer 0 into buffer 2, since buffer 1 is busy and buffer 2 is available. Concurrently, data destined for $M_a(a)$ is pushed into buffer 0, and data destined to $M_c(c)$ is evicted from the cache memory.

In cycle 9, data destined for $M_a(a)$ is pushed from buffer 0 into buffer 3. Data destined for $M_c(c)$ is pushed into buffer 0.

In cycle 10, the four buffers hold data from three different memory banks respectively. At most, two bank memories will be busy at any given time, so at least one of the pipeline buffers will always be able to write back its data to a corresponding memory bank, thereby making it available to accept data evicted from the cache.

The pipelining principles described herein may be extended in the multi-port memory (e.g., memory 1100 in FIG. 11) to obtain added benefits in certain applications, in accordance with other embodiments of the invention, as will become apparent to those skilled in the art given the teachings herein. To achieve this, modifications to one or more functional blocks in the memory may be required, such as, for example, modification of the controller, or pipelining input and/or output paths in the memory. Such pipelining may result in comparing read and write requests from different memory cycles rather than in current memory cycles.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

An integrated circuit in accordance with the present invention can be employed in essentially any application and/or electronic system in which multi-port memories are utilized (e.g., two-port SRAM, two-port eDRAM, etc.). Suitable systems for implementing techniques of the invention may include, but are not limited to, interface devices (e.g., interface networks, high-speed memory interfaces (e.g., DDR3, DDR4), etc.), personal computers, communication networks, electronic instruments (e.g., automated test equipment (ATE), measurement equipment, etc.), etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A memory operative to provide multi-port access functionality, the memory comprising:
    a plurality of single-port memory cells forming a first memory array, the first memory array being organized into a plurality of memory banks, each of the memory banks comprising a corresponding subset of the plurality of single-port memory cells;
    a second memory array, the second memory array comprising a plurality of multi-port memory cells and being operative to store status information of data stored in corresponding locations in the first memory array;
    at least one cache memory operatively connected with the first memory array, the cache memory being operative to store data for resolving concurrent read and write access conflicts to the first memory array during a same memory cycle; and
    a controller operative: to receive the status information from the second memory array and to determine a validity of data stored in the first memory array as a function of the status information; to control a manner in which data is stored in the memory for avoiding data overflow in the cache memory as a function of the status information; and to resolve concurrent read and write access conflicts to the first memory array during the same memory cycle.

2. The memory of claim 1, wherein the cache memory is shared among the plurality of memory banks and has a depth associated therewith, defining a number of addressable words in the cache memory, that is at least equal to a largest depth of a given one of the respective memory banks.

3. The memory of claim 1, wherein the second memory array has a depth associated therewith that is at least equal to a number of addresses in a logical address space of the memory.

4. The memory of claim 1, wherein the controller is operative to cause data corresponding to a write request to be stored at a location in the cache memory corresponding to the write request when a read request received during a same memory cycle as the write request corresponds to a same memory bank as the write request, and an entry in the second memory array corresponding to the write request indicates that data stored in the memory bank at an address corresponding to the write request is valid.

5. The memory of claim 1, wherein the second memory array has a width of one bit and a depth at least equal to a sum of respective depths of the plurality of memory banks in the first memory array.

6. The memory of claim 5, wherein the second memory array comprises a dual-port read, single-port write (2R1W) random access memory.

7. The memory of claim 1, wherein the second memory array comprises a plurality of storage tables, each storage table corresponding to a respective one of the plurality of memory banks in the first memory array, each storage table having a depth at least equal to a depth of a corresponding memory bank.

8. The memory of claim 7, wherein each of the plurality of storage tables comprises a single-port read, single-port write (1R1W) random access memory.

9. The memory of claim 1, wherein the status information stored in the second memory array is encoded in a manner which provides a subset of the memory banks in the first memory array that contain invalid data.

10. The memory of claim 9, wherein the second memory array comprises $\log_2(N+1)$ bits for indicating a status of data in N memory banks in the first memory array plus a case where all memory banks contain valid data.

11. The memory of claim 1, wherein the second memory array has a width of N bits, where N is an integer greater than one, and a depth at least equal to a sum of respective depths of the plurality of memory banks in the first memory array.

12. The memory of claim 11, wherein the second memory array is operative to mask a prescribed subset of the N bits of an address location to be written to thereby prevent updating the subset of the N bits with new data associated with a write request.

13. The memory of claim 1, wherein the status information stored in the second memory array is encoded in a manner which indicates which corresponding memory bank in the first memory array data in the cache memory belongs to.

14. The memory of claim 1, further comprising a pipeline circuit connected between the at least one cache memory and the first memory array.

15. The memory of claim 14, wherein the pipeline circuit is operative to remove data eviction critical paths between the cache memory and the first memory array, thereby reducing memory cycle time in the memory.

16. The memory of claim 14, wherein the pipeline circuit is operative to provide at least one additional cycle for data from the cache memory to be written into a corresponding memory bank in the first memory array, thereby reducing memory cycle time in the memory.

17. The memory of claim 14, wherein the pipeline circuit comprises at least two buffers connected in a parallel configuration between the cache memory and the first memory array, wherein data to be written into a corresponding memory bank in the first memory array is stored in the at least two buffers, the controller being operative to select one of the buffers for outputting data from the memory and to select one of the buffers for writing the data into the corresponding memory bank.

18. The memory of claim 14, wherein the pipeline circuit comprises at least first and second buffer stages connected together in series between the cache memory and the first memory array.

19. The memory of claim 1, further comprising a comparator operative to compare a first memory bank identifier corresponding to data that is to be potentially evicted from the cache memory at a given address offset $a_w$, associated with a write request with a second memory bank identifier corresponding to the write request, and to generate a first signal indicative of whether the first memory bank identifier is equal to the second memory bank identifier, wherein the controller is operative to determine whether data stored in the cache memory at the given address offset $a_w$ is to be evicted from the cache memory as a function of the first signal.

20. The memory of claim 1, further comprising:
a first address mapping block operative to receive a logical read address and to generate a physical read address offset and a read memory bank identifier as a function of the logical read address; and
a second address mapping block operative to receive a logical write address and to generate a physical write address offset and a write memory bank identifier as a function of the logical write address.

21. An integrated circuit, comprising:
at least one memory operative to provide multi-port access functionality, the at least one memory comprising:
a plurality of single-port memory cells forming a first memory array, the first memory array being organized into a plurality of memory banks, each of the memory banks comprising a corresponding subset of the plurality of single-port memory cells;
a second memory array, the second memory array comprising a plurality of multi-port memory cells and being operative to store status information of data stored in corresponding locations in the first memory array;
at least one cache memory operatively connected with the first memory array, the cache memory being operative to store data for resolving concurrent read and write access conflicts to the first memory array during a same memory cycle; and
a controller operative: to receive the status information from the second memory array and to determine a validity of data stored in the first memory array as a function of the status information; to control a manner in which data is stored in the memory for avoiding data overflow in the cache memory as a function of the status information; and to resolve concurrent read and write access conflicts to the first memory array during the same memory cycle.

22. A memory operative to provide n-port access functionality, where n is an integer greater than one, the memory comprising:
- a plurality of m-port memory cells forming a first memory array, the first memory array being organized into a plurality of memory banks, each of the memory banks comprising a corresponding subset of the plurality of m-port memory cells, where m is an integer less than n;
- a second memory array, the second memory array comprising a plurality of multi-port memory cells and being operative to track status information of data stored in corresponding locations in the first memory array;
- at least one cache memory operatively connected with the first memory array, the cache memory being operative to store data for resolving concurrent read and write access conflicts to the first memory array during a same memory cycle; and
- a controller operative: to receive the status information from the second memory array and to determine a validity of data stored in the first memory array as a function of the status information; to control a manner in which data is stored in the memory for avoiding data overflow in the cache memory as a function of the status information; and to resolve concurrent read and write access conflicts to the first memory array during the same memory cycle.

23. An electronic system, comprising:
- at least one integrated circuit, the at least one integrated circuit including at least one memory operative to provide n-port access functionality, where n is an integer greater than one, the at least one memory comprising:
  - a plurality of m-port memory cells forming a first memory array, the first memory array being organized into a plurality of memory banks, each of the memory banks comprising a corresponding subset of the plurality of m-port memory cells, where m is an integer less than n;
  - a second memory array, the second memory array comprising a plurality of multi-port memory cells and being operative to track status information of data stored in corresponding locations in the first memory array;
  - at least one cache memory operatively connected with the first memory array, the cache memory being operative to store data for resolving concurrent read and write access conflicts to the first memory array during a same memory cycle; and
  - a controller operative: to receive the status information from the second memory array and to determine a validity of data stored in the first memory array as a function of the status information; to control a manner in which data is stored in the memory for avoiding data overflow in the cache memory as a function of the status information; and to resolve concurrent read and write access conflicts to the first memory array during the same memory cycle.

* * * * *